(12) United States Patent
Lee et al.

(10) Patent No.: US 12,002,411 B2
(45) Date of Patent: Jun. 4, 2024

(54) POV DISPLAY DEVICE AND CONTROL METHOD THEREFOR

(71) Applicant: LG ELECTRONICS INC., Seoul (KR)

(72) Inventors: Kyungho Lee, Seoul (KR); Soobeom Lee, Seoul (KR); Jaewoon Lee, Seoul (KR); Jeongin Cheon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/022,403

(22) PCT Filed: Aug. 20, 2020

(86) PCT No.: PCT/KR2020/011092
§ 371 (c)(1),
(2) Date: Feb. 21, 2023

(87) PCT Pub. No.: WO2022/039298
PCT Pub. Date: Feb. 24, 2022

(65) Prior Publication Data
US 2023/0326397 A1    Oct. 12, 2023

(51) Int. Cl.
*G09G 3/32* (2016.01)
*F16M 11/08* (2006.01)
*H01L 33/62* (2010.01)

(52) U.S. Cl.
CPC .............. *G09G 3/32* (2013.01); *F16M 11/08* (2013.01); *H01L 33/62* (2013.01); *F16M 2200/00* (2013.01); *G09G 2300/04* (2013.01)

(58) Field of Classification Search
CPC ........ G09G 3/32; G09G 2300/04; G09G 3/14; G09G 3/005; F16M 11/08;
(Continued)

(56) References Cited

U.S. PATENT DOCUMENTS

2004/0102223 A1*   5/2004   Lo ........................ G09G 3/005
                                                                 455/566
2016/0119616 A1*   4/2016   De Collibus ........ G03B 21/562
                                                                 353/121
(Continued)

FOREIGN PATENT DOCUMENTS

KR       2000-0012359 U      7/2000
KR       10-0942557 B1       2/2010
(Continued)

*Primary Examiner* — Richard J Hong
(74) *Attorney, Agent, or Firm* — Birch, Stewart, Kolasch & Birch, LLP

(57) ABSTRACT

The present invention relates to a rotary type display device comprising a fixed module and a rotation module, wherein the rotation module comprises: a rotating body frame; a light source module; a first sensor for sensing a rotational speed and a phase of the rotation module; and an image output control unit for controlling an image output using the light source module, by using a first sensing value obtained through the first sensor, and the fixed module comprises: a fixed body frame; a motor for rotating the rotating body frame; a second sensor for sensing the rotational speed and the phase of the rotation module; and a motor control unit for controlling at least one of the rotational speed and phase of the motor by using a second sensing value obtained through the second sensor.

19 Claims, 19 Drawing Sheets

(58) Field of Classification Search
CPC ..... F16M 2200/00; H01L 33/62; G09F 13/30; G09F 19/12; G03B 21/562
See application file for complete search history.

(56) References Cited

U.S. PATENT DOCUMENTS

| | | | |
|---|---|---|---|
| 2017/0124925 A1 | 5/2017 | Chykeyuk et al. | |
| 2019/0228690 A1* | 7/2019 | Meng | G09G 3/14 |
| 2019/0340962 A1* | 11/2019 | Trehan | G09G 3/005 |
| 2019/0371217 A1* | 12/2019 | Chykeyuk | G09F 19/12 |

FOREIGN PATENT DOCUMENTS

| | | | |
|---|---|---|---|
| KR | 10-2018-0090171 A | 8/2018 | |
| KR | 10-2020797 B1 | 9/2019 | |
| WO | WO-2020175861 A1 * | 9/2020 | G09F 13/30 |

* cited by examiner

POV DISPLAY DEVICE AND CONTROL METHOD THEREFOR

CROSS REFERENCE TO RELATED APPLICATIONS

This application is the National Phase of PCT International Application No. PCT/KR2020/011092, filed on Aug. 20, 2020, all of which are hereby expressly incorporated by reference into the present application.

TECHNICAL FIELD

The present disclosure is applicable to a display device-related technical field, and relates to, for example, a POV display device using a light-emitting diode (LED), which is a semiconductor light-emitting element.

BACKGROUND

In a field of a display technology, display devices with excellent characteristics such as thinness and flexibility are being developed. In contrast, currently commercialized major displays are represented by a liquid crystal display (LCD) and an organic light-emitting diode (OLED).

Recently, there is a POV display device capable of reproducing various texts and graphics as well as moving images using an afterimage effect of a human by rotating a light-emitting module in which light-emitting elements are arranged one-dimensionally, and at the same time, driving the module at a high speed depending on an angle.

Usually, when continuously observing 24 or more still images per second, a viewer perceives the still images as the moving image. In the case of an existing image display device such as a CRT, an LCD, or a PDP, the still images of 30 to 60 frames are displayed per second so as to be recognized by the viewer as the moving image. In this regard, when more still images are continuously observed per second, the observer may feel the images smoother. In addition, as the number of still images displayed per second decreases, it becomes difficult to smoothly express the images.

In this regard, in the case of a rotatable display, because a physical position of a light source module changes with time, it is necessary to synchronize a rotation period of the motor with an output period of the image so as to keep an output position of the image constant.

However, in an existing rotatable display device, an IR sensor light emitter is disposed in a fixed portion and an IR sensor light receiver is disposed in a rotary portion to measure a speed and a phase value of the rotary portion. In this case, because the sensed value can be obtained only from a controller located in the fixed portion, there is a problem in that the speed and the phase value of the rotating module cannot be measured in the rotary portion.

Therefore, in the present disclosure, a technology capable of performing constant speed control and precise position control of the motor included in the rotatable display device is presented.

SUMMARY

Technical Problem

An object of an embodiment of the present disclosure is to realize constant speed control and precise position control of a motor in a rotatable display device.

Furthermore, another object of one embodiment of the present disclosure is to solve various problems not mentioned herein. A person skilled in the art may understand the entire meaning of the present document and drawings.

Technical Solutions

In a rotatable display device including a fixed portion and a rotary portion rotating relative to the fixed portion for achieving the above objects, the rotary portion includes a rotating frame connected to the fixed portion and rotating, a light source module disposed on the rotating frame and including at least one panel, a first sensor for sensing a rotational speed and a phase of the rotary portion, and an image output controller that controls output of an image using the light source module using first sensed values obtained via the first sensor, and the fixed portion includes a fixed frame constituting a main body thereof, a motor disposed on the fixed frame and rotationally driving the rotating frame, a second sensor for sensing the rotational speed and the phase of the rotary portion, and a motor controller that controls at least one of a rotational speed and a phase of the motor using second sensed values obtained via the second sensor.

In addition, the first sensor may include a first light receiver for receiving light irradiated from a light emitter disposed on the fixed frame.

In addition, the second sensor may include a second light receiver for receiving light irradiated from a light emitter disposed on the rotating frame.

In addition, the rotating frame may include a reflector for reflecting light emitted from the light emitter, and the second sensor may include a third light receiver for receiving light reflected by the reflector.

In addition, the rotating frame may include a plurality of reflectors along a rotational circumferential direction.

In addition, the second sensor may be a hall sensor for sensing a magnetic field of a magnetic body disposed in the rotating frame.

In addition, the motor controller may compare a speed input value of the motor with a speed measured value of the motor obtained via the second sensor to perform constant speed control the motor with a speed corrected value of the motor.

In addition, the motor controller may compare a phase input value of the motor with a phase measured value of the motor obtained via the second sensor to perform constant phase control the motor with a phase corrected value of the motor.

In addition, the motor controller may include a PID controller for performing constant speed control and precise position control of the motor.

In addition, the motor controller may perform constant phase control of the motor and sequentially perform constant speed control of the motor.

In addition, the motor controller may obtain a reference speed that is a speed of the motor for performing the constant phase control of the motor, and compare the reference speed with a speed measured value of the motor to perform the constant speed control of the motor with the reference speed value.

In addition, the motor controller may set the reference speed as an acceleration reference speed to perform the constant phase control of the motor in a rotational direction in an operation of accelerating the motor.

In addition, the motor controller may set the reference speed as a deceleration reference speed to perform the constant phase control of the motor in an opposite direction of a rotational direction in an operation of decelerating the motor.

In addition, the motor controller may perform constant phase control and sequentially perform constant speed control of the motor when a speed input value of the motor is smaller than a preset speed.

In addition, the motor controller may perform constant phase control of the motor and omit constant speed control when a speed input value of the motor is equal to or greater than a preset speed.

Advantageous Effects

According to one embodiment of the present disclosure, in the rotatable display device including the fixed portion and the rotary portion rotating relative to the fixed portion, the speed and the phase of the rotary portion may be sensed more accurately via the first sensor and the second sensor.

In addition, at least one of the speed and the phase of the module may be controlled using at least one of the measured speed and phase values.

According to another embodiment of the present disclosure, there are also additional technical effects not mentioned herein. A person skilled in the art may understand the entire meaning of the present document and drawings.

DETAILED DESCRIPTION

Reference will now be made in detail to embodiments of the present disclosure, examples of which are illustrated in the accompanying drawings. Wherever possible, the same reference numbers will be used throughout the drawings to refer to the same or like parts, and a redundant description thereof will be omitted. As used herein, the suffixes "module" and "unit" are added or used interchangeably to facilitate preparation of this specification, and are not intended to suggest distinct meanings or functions. In describing embodiments disclosed in this specification, relevant well-known technologies may not be described in detail in order to avoid obscuring the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining two or more drawings are also within the scope of the present disclosure.

In addition, when an element such as a layer, a region, or a substrate is described as being "on" another element, it is to be understood that the element may be directly on the other element, or there may be an intermediate element between them.

The display device described herein conceptually includes all display devices that display information with a unit pixel or a set of unit pixels. Therefore, the term "display device" may be applied not only to finished products but also to parts. For example, a panel corresponding to a part of a digital TV also independently corresponds to the display device in the present specification. Such finished products include a mobile phone, a smartphone, a laptop computer, a digital broadcasting terminal, a personal digital assistant (PDA), a portable multimedia player (PMP), a navigation system, a slate PC, a tablet PC, an Ultrabook, a digital TV, a desktop computer, and the like.

However, it will be readily apparent to those skilled in the art that the configuration according to the embodiments described herein is also applicable to new products to be developed later as display devices.

In addition, the term "semiconductor light-emitting element" mentioned in this specification conceptually includes an LED, a micro LED, and the like, and may be used interchangeably therewith.

Figure 1:
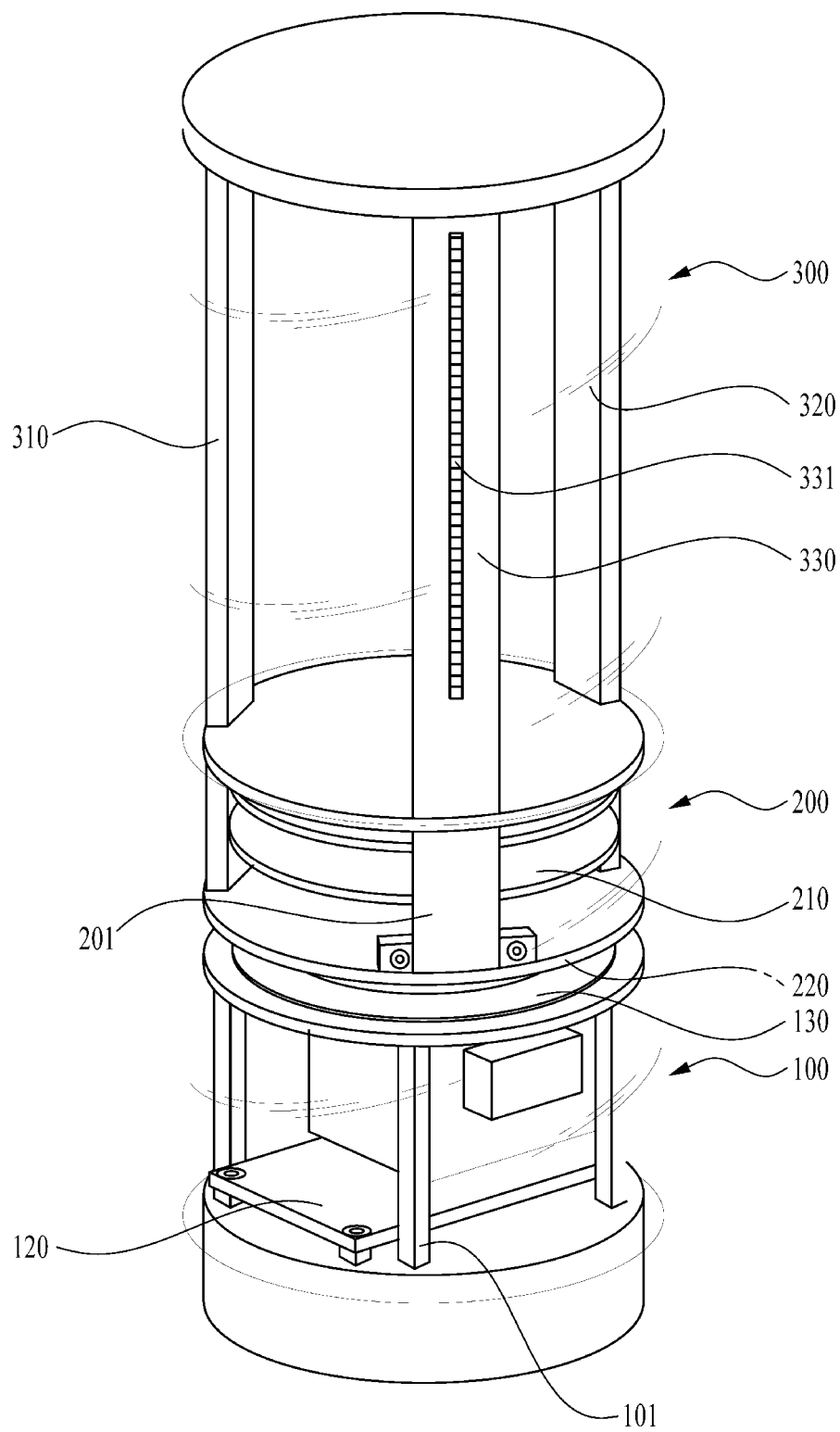
FIG. 1 is a perspective view illustrating a rotatable display device according to a first embodiment of the present disclosure.

FIG. 1 is a perspective view illustrating a rotating display device according to a first embodiment of the present disclosure.

FIG. 1 illustrates a cylindrical rotating display device in which light-emitting element array 311 is respectively and longitudinally provided at one or more panels 310, 320 and 333 disposed along the circumferential surface of the rotating display device. In FIG. 1, only the light-emitting element array 311 that is provided at the front panel 330 is viewable. Although the light-emitting element arrays provided at the left panel 310 and the right panel 320 are not shown in the drawing, light-emitting element arrays each having the same structure may also be applied to the left panel 310 and the right panel 320.

Broadly speaking, the rotating display device may include a fixed portion 100 including a motor 110 (see FIG. 7), a rotary portion 200, which is positioned on the fixed portion 100 and is rotated by the motor 110, and a light source module 300, which is coupled to the rotary portion 200 and includes the light-emitting element array 311 mounted on the panels 310, 320, and 330 (hereinafter, referred to as "first panels") to embody a display configured to display an after-image by rotation thereof.

Here, the light source module 300 may include the light-emitting element arrays 311, which are respectively and longitudinally mounted on the one of more bar-shaped first panels 310, 320 and 330, which are disposed on the cylindrical outer circumferential surface at regular intervals.

In FIG. 1, the light source module 300 may include three first panels 310, 320 and 330, each of which includes the light-emitting element array 311 (hereinafter, referred to as a "first light-emitting element array"). However, this embodiment is only one example, and the light source module 300 may include one or more panels.

The first light-emitting element array 311 may be constructed such that pixels are longitudinally arranged on each of the first panels 310, 320 and 330. Here, subpixels constituting each of the pixels may be arranged in a direction perpendicular to the longitudinal direction. Furthermore, the subpixels constituting each of the pixels may be arranged in a direction parallel to the longitudinal direction.

The subpixels of each of the pixels may sequentially emit light in the pixel.

A detailed description of the first light-emitting element array 311 included in the light source module 300 will be given later.

The first panels 310, 320 and 330, which constitutes the light source module 300, may be embodied as printed circuit boards (PCBs). In other words, each of the first panels 310, 320 and 330 may have the function of a printed circuit board. The light-emitting array of each of the first panels 310, 320 and 330 may constitute a unit pixel and may be arranged in the longitudinal direction of the panel.

The panel equipped with the light-emitting element array may be rotated so as to realize a display using an after-image. Realization of the after-image will be described in detail later.

Although the light source module 300 may be constituted by a plurality of first panels 310, 320 and 330, as described above, the light source module 300 may also be constituted by a single panel equipped with a light-emitting array. When the light source module 300 is constituted by a plurality of panels, as shown in FIG. 1, a plurality of sub-images, which are allocated to the plurality of panels, may realize one single frame image. Accordingly, the light source module 300 may be rotated at a rotational speed lower than in the case in which the same frame is realized by a single panel.

The fixed portion 100 may constitute a frame structure. In other words, the fixed portion 100 may include a plurality of frames 101, which are designed to be coupled to each other so as to constitute the fixed portion 100.

The frame structure may provide a space in which the motor 110 is mounted and a space in which a power supply 120, an RF module 126 (see FIG. 7), and the like are mounted.

Furthermore, the fixed portion 100 may be provided with a weight (not shown) configured to reduce the influence of high-speed rotation of the rotary portion 200.

Similar to the fixed portion 100, the rotary portion 200 may also constitute a frame structure. In other words, the rotary portion 200 may include a plurality of frames 201, which are designed to be coupled to each other to constitute the rotary portion 200.

The frame structure may provide a space in which a driving circuit 210 configured to drive the first light-emitting array 311 to realize a display is mounted.

The driving shaft of the motor 110 may be fixed to a shaft-fixing portion (not shown) formed at the frames 201 of the rotary portion 200. As a result, the driving shaft of the motor 110 may be positioned coaxially with the rotational center of the rotary portion 200.

The light source module 300 may be fixed to the upper sides of the frames 201.

Power may be transmitted between the fixed portion 100 and the rotary portion 200 via wireless power transmission. To this end, a transmission coil 130 may be mounted on the upper side of the fixed portion 100 so as to transmit power in a wireless manner, and a receiving coil 220 may be mounted on the lower side of the rotary portion 200 at a position that faces the transmission coil 130.

Figure 2:
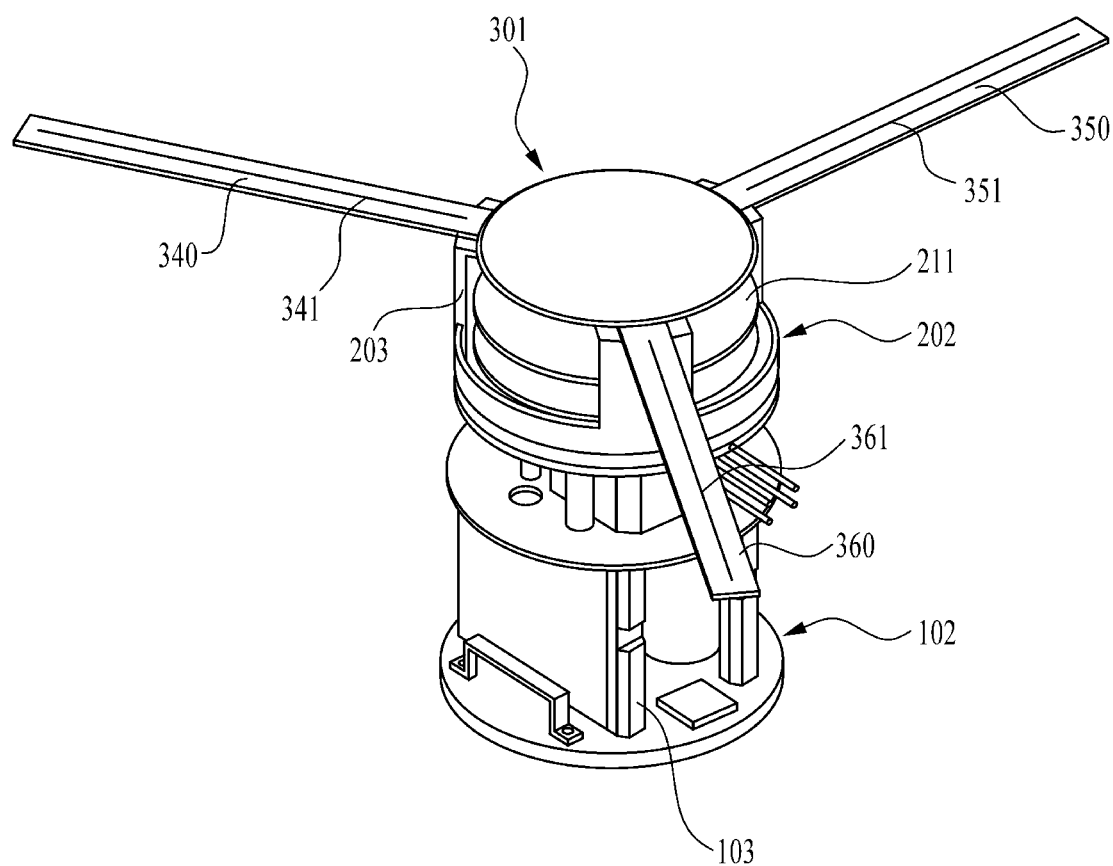
FIG. 2 is a perspective view illustrating a rotatable display device according to a second embodiment of the present disclosure.

FIG. 2 is a perspective view illustrating a rotating display device according to a second embodiment of the present disclosure.

FIG. 2 illustrates a rotating display device in which light-emitting element arrays 341, 351, and 361 (hereinafter, referred to as a second light-emitting element arrays) are provided at respective blade panels 340, 350 and 360 (hereinafter, referred to as second panels) in the longitudinal directions of the respective panels.

Broadly speaking, the rotary display device may include a fixed portion 102 including a motor 110 (see FIG. 7), a rotary portion 202, which is positioned on the fixed portion 102 and is rotated by a motor 110, and a light source module 301, which includes second light-emitting element arrays 341, 351, and 361 and displays an after-image to realize a display by rotation thereof.

As illustrated in the drawing, the light source module 301 may include one or more second bar-shaped panels 340, 350 and 360, which are radially disposed about the rotational center thereof, and the second light-emitting element arrays 341, 351, and 361, which are respectively disposed on the second panels 340, 350 and 360 in the respective longitudinal directions thereof.

In this way, the light source module 301 may be composed of the second panels 340, 350, and 360 on which the second light-emitting element arrays 341, 351, and 361 are respectively arranged.

Although the light source module 301 may be composed of a plurality of second panels 340, 350 and 360, the light source module 301 may also be composed of a single panel on which a light-emitting element array is disposed. When the light source module 301 is constituted as a plurality of panels, as shown in FIG. 2, a plurality of sub-images, which are allocated to the plurality of panels, may realize one single frame image. Accordingly, the light source module 301 may be rotated at a rotational speed lower than the case in which the same frame is realized by a single panel.

Individual pixels may be longitudinally disposed in each of the second light-emitting element arrays 341, 251 and 361 of the second panels 340, 350 and 360. The subpixels constituting each of the pixels may be arranged in a direction perpendicular to the longitudinal direction. Meanwhile, the subpixels constituting each of the pixels may be arranged in a direction parallel to the longitudinal direction.

A concrete description of the second light-emitting element arrays 341, 351, and 361 provided in the light source module 301 will be made in detail later.

The fixed portion 102 may constitute a frame structure. In other words, the fixed portion 102 may include a plurality of frames 103, which are designed to be coupled to each other to constitute the fixed portion 102.

The frame structure may provide a space, in which the motor 110 is mounted, and a space in which the power supply 120, the RF module 126 (see FIG. 7), and the like are mounted.

Furthermore, the fixed portion 102 may be provided with a weight (not shown) configured to reduce the influence of high-speed rotation of the rotary portion 202.

Similarly to the fixed portion 102, the rotary portion 202 may also constitute a frame structure. In other words, the rotary portion 202 may include a plurality of frames 203, which are designed to be coupled to each other to constitute the rotary portion 202.

The frame structure may provide a space in which the driving circuit 210 configured to drive the second light-emitting arrays 341, 351, and 361 to realize a display, is mounted.

The driving shaft of the motor 110 may be fixed to a shaft-fixing portion (not shown) formed at the frames 203 of the rotary portion 202. As a result, the driving shaft of the motor 110 may be positioned coaxially with the rotational center of the rotary portion 202.

The light source module 301 may be fixed to the upper sides of the frames 201.

Although the second embodiment of the present disclosure has been described heretofore with reference to FIG. 2, the second embodiment may be substantially identical to the first embodiment, with the exception of the difference in the configuration of the light source module 301. Accordingly, the configuration of the first embodiment may be similarly applied to components of the second embodiment that have not been described herein.

Figure 3:
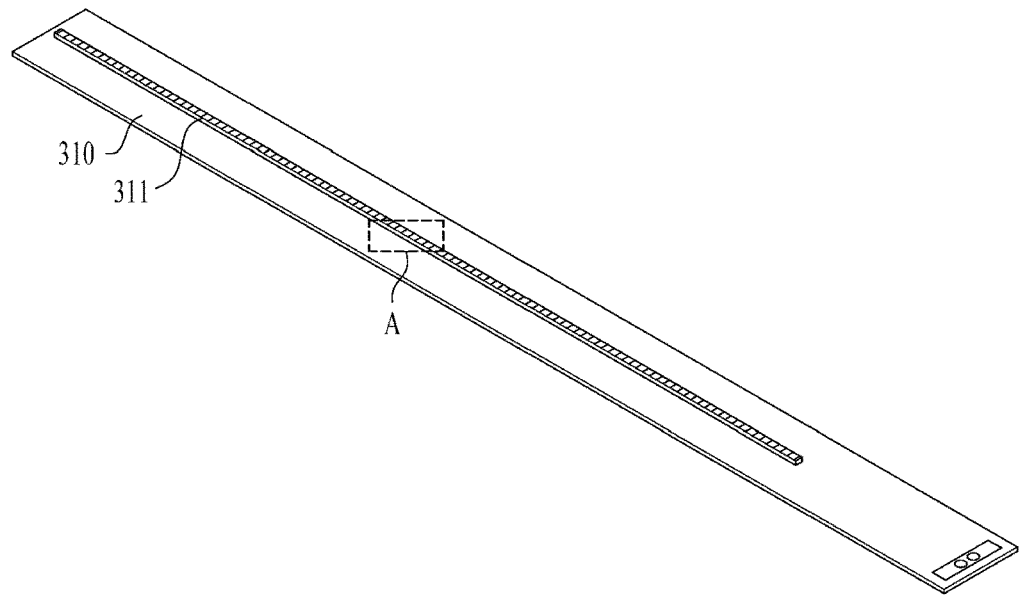
FIG. 3 is a perspective view showing the front surface of a light source module according to the present disclosure.
Figure 4:
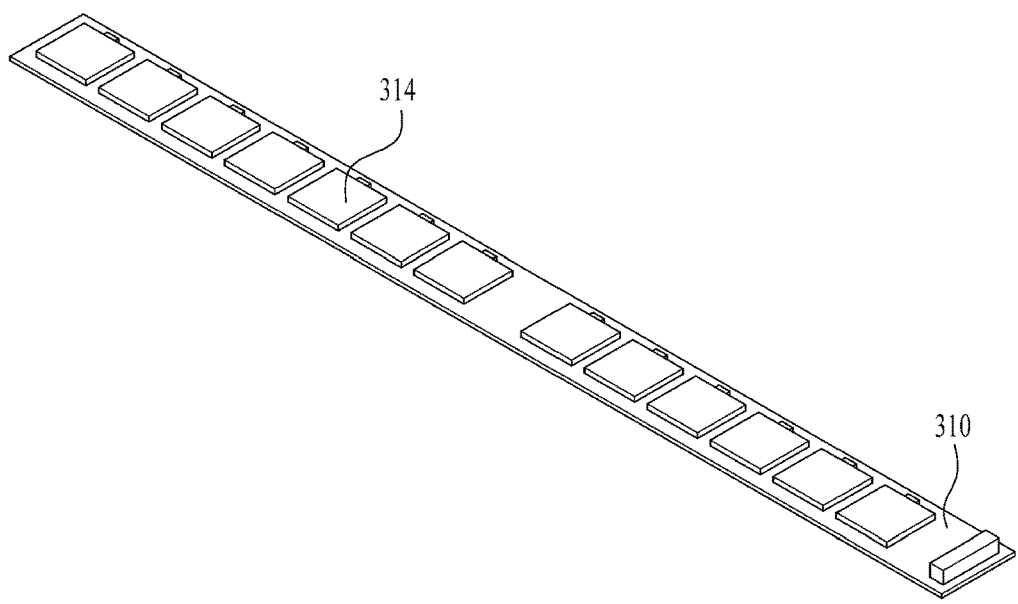
FIG. 4 is a perspective view showing the rear surface of the light source module according to the present disclosure.

FIG. 3 is a perspective view showing the front surface of a light source module according to the first embodiment of the present disclosure, and FIG. 4 is a perspective view showing the rear surface of the light source module according to the first embodiment of the present disclosure.

Although FIGS. 3 and 4 illustrate the first panel 310 of the first embodiment as an example, the configuration illustrated in FIGS. 3 and 4 may be identically applied not only to the other panels 320 and 330 but also to the panels 340, 350, and 360 of the second embodiment. That is, the light source module of the first embodiment and the light source module of the second embodiment may have the same configuration.

In other words, each of the first light-emitting element arrays 311 and each of the second light-emitting element arrays 341, 351, and 361 may have the same structure. Hereinafter, the light source module will be described based on the first light-emitting element array 311.

FIG. 3 illustrates one panel 310 forming the light source module 300. As mentioned above, the panel 310 may be a printed circuit board (PCB). A plurality of light-emitting elements 312 (refer to FIG. 5) may be mounted on the panel 310 so as to be disposed in one direction to form pixels, thereby constituting the light-emitting element array 311. Here, a light-emitting diode (LED) may be used as the light-emitting element.

That is, the light-emitting elements 312 are disposed in one direction on one panel 310 to form individual pixels, with the result that the light-emitting element array 311 may be provided so as to be linearly mounted.

FIG. 4 illustrates the rear surface of the panel 310. Drivers 314 for driving the light-emitting elements 312 may be mounted on the rear surface of the panel 310, which constitutes the light source module.

Since the drivers 314 are mounted on the rear surface of the panel 310, as described above, the drivers 314 may not interfere with a light-emitting surface, the influence on light emission from the light sources (the light-emitting elements) 312 due to interference may be minimized, and the area of the panel 310 may be minimized. The panel 310, having a small area, may improve the transparency of the display.

Meanwhile, the front surface of the panel 310, on which the light-emitting element array 311 is mounted, may be processed into a dark color (e.g. black) in order to improve the contrast ratio and the color expression of the display, thereby maximizing the effect of the light sources.

Figure 5:
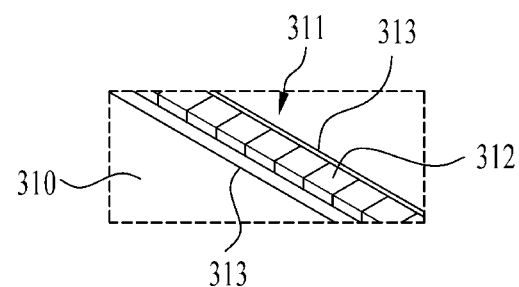
FIG. 5 is an enlarged view of portion A in FIG. 3.
Figure 6:
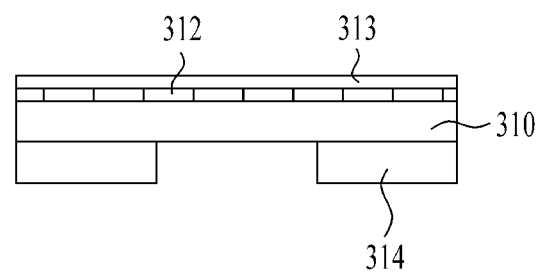
FIG. 6 is a cross-sectional view of the light source module according to the present disclosure.

FIG. 5 is an enlarged view of portion A in FIG. 3, and FIG. 6 is a cross-sectional view of the light source module according to the present disclosure.

Referring to FIG. 5, it can be seen that the individual light-emitting elements 312 are mounted linearly in one direction (the longitudinal direction of the panel). In this case, a protective portion 313 may be located outside the light-emitting elements 312 in order to protect the light-emitting elements 312.

Red, green, and blue light-emitting elements 312 may form one pixel in order to realize natural colors, and the individual pixels may be mounted in one direction on the panel 310.

Referring to FIG. 6, the light-emitting elements 312 may be protected by the protective portion 313. Further, as described above, the drivers 314 may be mounted on the rear surface of the panel 310, and may drive the light-emitting elements 312 in units of pixels or subpixels. In this case, one driver 314 may individually drive at least one pixel.

Figure 7:
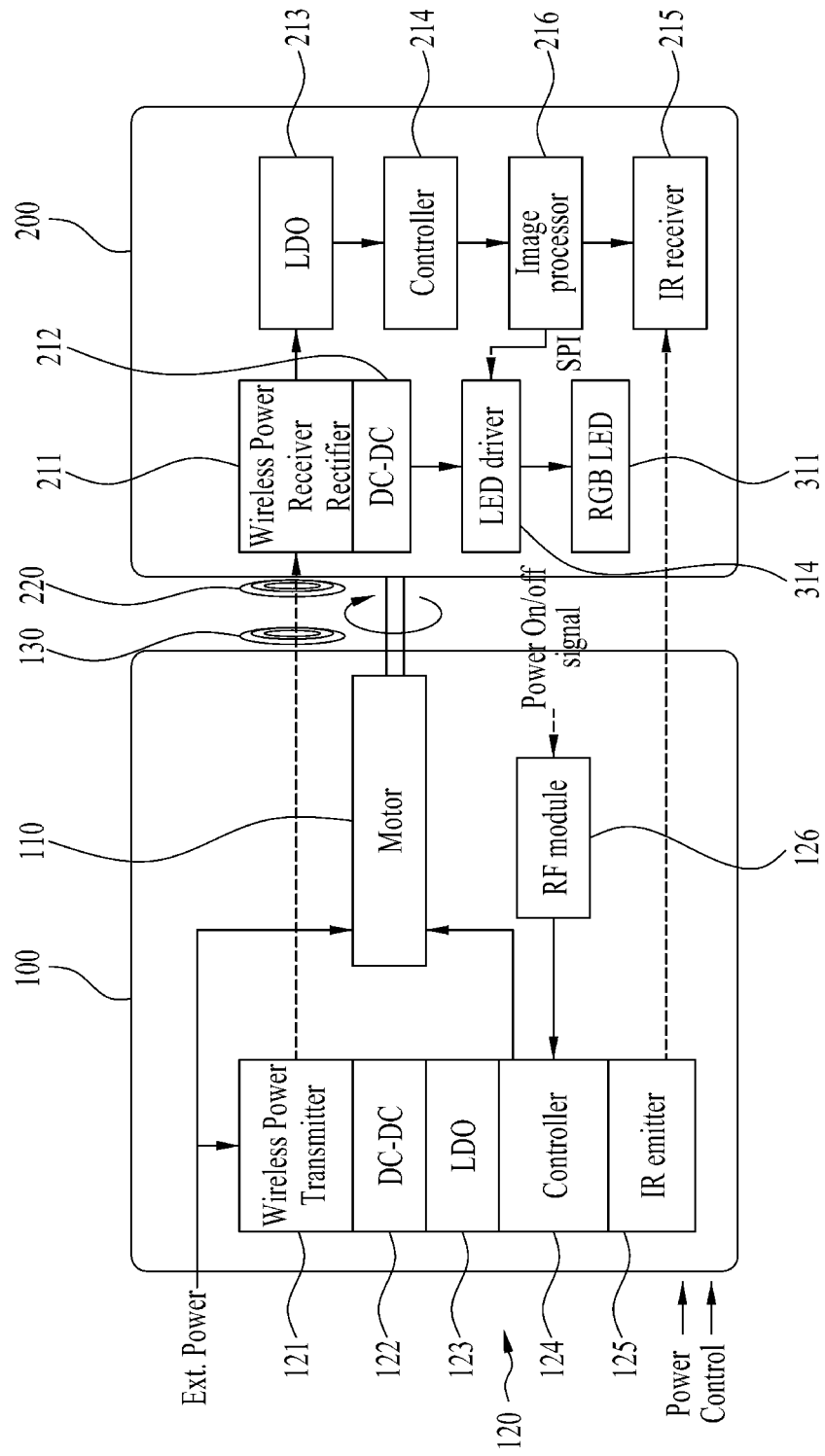
FIG. 7 is a block diagram of the rotatable display device according to the present disclosure.

FIG. 7 is a block diagram of the rotating display device according to the present disclosure.

Hereinafter, a configuration for driving the rotating display device will be described briefly with reference to FIG. 7. Although this configuration will be described with reference to the first embodiment described above, the same may also be identically applied to the second embodiment.

First, a driving circuit 210 may be mounted to the fixed portion 100. The driving circuit 120 may include a power supply. The driving circuit 120 may include a wireless power transmitter 121, a DC-DC converter 122, and a voltage generator 123 for supplying individual voltages.

External power may be supplied to the driving circuit 120 and the motor 110.

In addition, an RF module 126 may be provided at the fixed portion 100, so that the display may be driven in response to a signal transmitted from the outside.

Meanwhile, a means for sensing rotation of the rotary portion 200 may be provided at the fixed portion 100. Infrared radiation may be used to sense rotation. Accordingly, an IR emitter 125 may be mounted to the fixed portion 100, and an IR receiver 215 may be mounted to the rotary portion 200 at a position corresponding to the IR emitter 125.

In addition, a controller 124 may be provided at the fixed portion 100 in order to control the driving circuit 120, the motor 110, the IR emitter 125, and the RF module 126.

Meanwhile, the rotary portion 200 may include a wireless power receiver 211 for receiving a signal from the wireless power transmitter 121, a DC-DC converter 212, and a voltage generator (LDO) 213 for supplying individual voltages.

The rotary portion 200 may be provided with an image processor 216 in order to realize an image through the light-emitting element array using RGB data of an image to be displayed. The signal processed by the image processor 216 may be transmitted to the drivers 314 of the light source module, and thus an image may be realized.

In addition, a controller 214 may be mounted to the rotary portion 200 in order to control the wireless power receiver 211, the DC-DC converter 212, the voltage generator (LDO) 213, the IR receiver 215, and the image processor 216.

The image processor 216 may generate a signal for controlling light emission from the light sources of the light source module based on data of an image to be output. At this time, the data for light emission from the light source module may be internal data or external data.

The data stored in the internal device (the rotary portion 200) may be image data pre-stored in a storage device, such as a memory (an SD-card) mounted together with the image processor 216. The image processor 216 may generate a light emission control signal based on the internal data.

The image processor 216 may transmit control signals to the drivers 314 so that the first light-emitting element arrays 311 and the second light-emitting element arrays 341, 351, and 361 display image data of a specific frame in a delayed manner.

Meanwhile, the image processor 216 may receive image data from the fixed portion 100. At this time, external data may be output through an optical data transmission device, such as a photo coupler, or an RF-type data transmission device, such as a Bluetooth or Wi-Fi device.

In this case, as mentioned above, a means for sensing rotation of the rotary portion 200 may be provided. That is, the IR emitter 125 and the IR receiver 215 may be provided as a means for detecting the rotational position (speed) of the rotary portion 200, such as an absolute rotational position or a relative rotational position, in order to output light source data suitable for each rotational position (speed) during rotation of the rotary portion 200. Alternatively, this function may also be achieved using an encoder, a resolver, or a Hall sensor.

Meanwhile, data required to drive the display may be transmitted as a signal in an optical manner at low cost using the principle of a photo coupler. That is, if the fixed portion 100 and the rotary portion 200 are provided with a light emitter and a light receiver, reception of data is continuously possible even when the rotary portion 200 rotates. Here, the IR emitter 125 and the IR receiver 215 described above may be used to transmit data.

As described above, power may be transferred between the fixed portion 100 and the rotary portion 200 in a wireless power transfer (WPT) manner.

Wireless power transfer enables the supply of power without connection of a wire using a resonance phenomenon of a coil.

To this end, the wireless power transmitter 121 may convert power into an RF signal of a specific frequency, and a magnetic field generated by current flowing through the transmission coil 130 may generate an induced current in the reception coil 220.

At this time, the natural frequency of the coil and the transmission frequency for transferring actual energy may differ from each other (a magnetic induction method).

Meanwhile, the resonant frequencies of the transmission coil 130 and the reception coil 220 may be the same (a magnetic resonance method).

The wireless power receiver 211 may convert the RF signal input from the reception coil 220 into direct current, and may transmit required power to a load.

Figure 8:
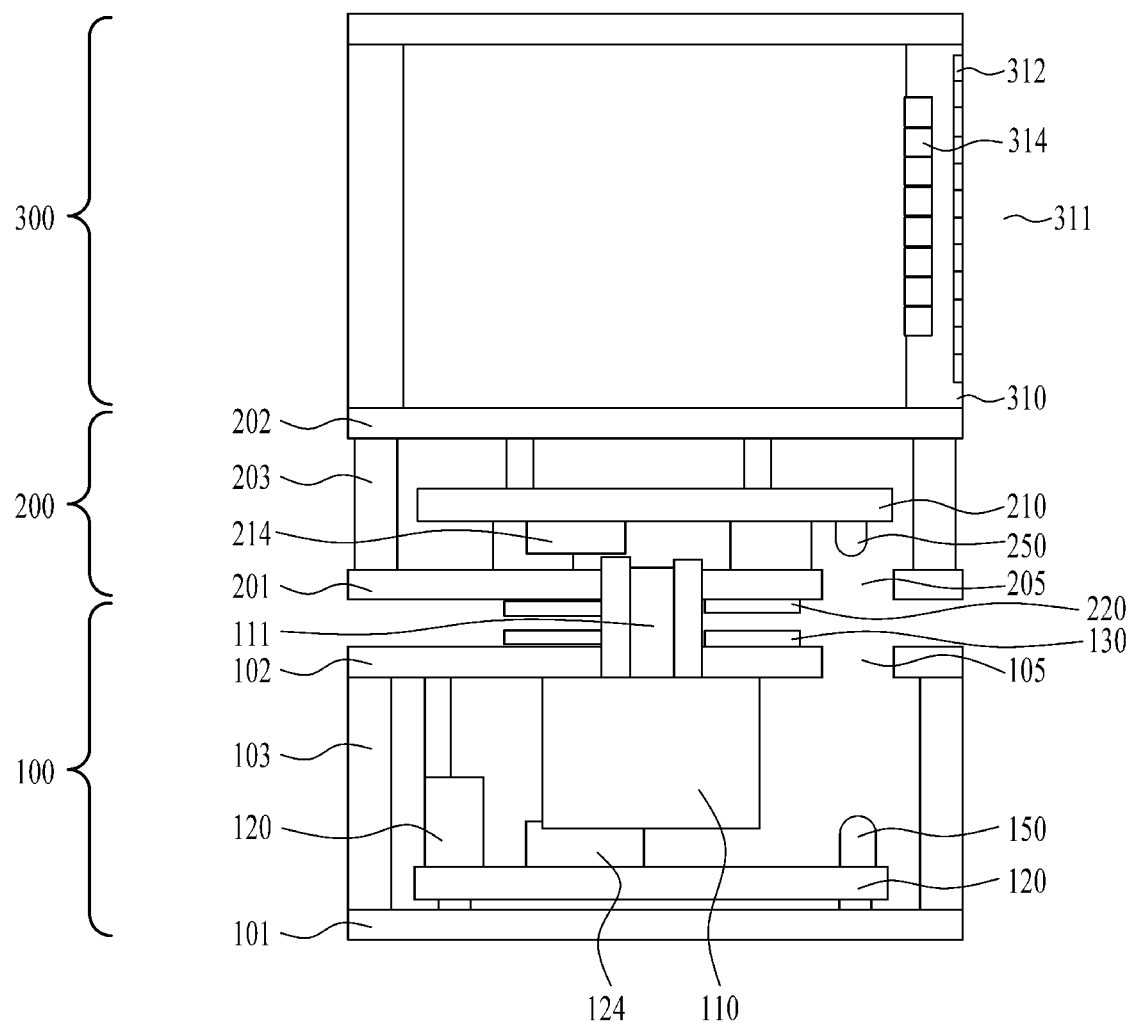
FIG. 8 is a cross-sectional view of a rotatable display device.

FIG. 8 is a cross-sectional view of a rotary portion and a fixed portion of a rotatable display device according to the present disclosure. Although a cylinder type rotatable display device is shown in FIG. 8, contents described below may also be applied to a fan type rotatable display device.

The display device in FIG. 8 may include a fixed portion 100, a rotary portion 200 connected to the fixed portion 100, and the light source module 300 connected to the rotary portion 100.

Illustrated is the cylinder type rotatable display device in which each light-emitting element array 311 is disposed on each of at least one panel 310 disposed along an imaginary cylindrical outer circumferential surface so as to be directed in a longitudinal direction of each panel. The light-emitting element array 311 installed on the panel may include the light source module that implements a display by displaying an afterimage by rotation.

The light source module may include each light-emitting element array 311 mounted in the longitudinal direction on each of the one or more rod-shaped panels arranged at a regular spacing on the cylindrical outer circumferential surface. In the light-emitting element array 311, individual pixels 312 may be arranged in the longitudinal direction on each panel 310.

In one example, the fixed portion 100 may be composed of frame structures 101, 102, and 103. That is, the fixed portion 100 may include a lower frame 101, an upper frame 102, and a connecting frame 103 for connecting the lower frame 101 and the upper frame 102 to each other.

Such frame structures 101, 102, and 103 may provide a space in which the motor 110 may be installed, and provide a space in which the power supply 120, the RF module, and the like may be installed.

Similarly, the rotary portion 200 may be composed of frame structures 201, 202, and 203. That is, the rotary portion 200 may include a lower frame 201, an upper frame 202, and a connecting frame 203 for connecting the lower frame 201 and the upper frame 202 to each other.

Such frame structures 201, 202, and 203 may provide a space in which the driving circuit 210 that drives the light-emitting element array 311 to implement the display is installed.

In this regard, a driving shaft 111 of the motor 110 may be coupled to a first side of the rotary portion 200. In this regard, the first side of the rotary portion 200 may be the lower frame 201 positioned at a lower portion of the rotary portion 200. Hereinafter, the case in which the lower side (the first side) of the rotary portion 200 coupled to the motor 110 is the lower frame 201 will be described as an example. However, the present disclosure is not limited thereto.

More specifically, the driving shaft 111 of the motor 110 may be fixed to a shaft fixing portion 204 formed on the lower frame 201. As such, the driving shaft of the motor 110 and a center of rotation of the rotary portion 200 may be located on the same axis. As such, the lower side of the rotary portion 200 may be coupled to the driving shaft 111 of the motor 110.

The light source module 300 may be fixedly installed on top of the upper frame 202 of the rotary portion 200.

A cover frame constituting a second side of the rotary portion 200 may be positioned on the panel 310 constituting the light source module 300.

A second sensor 150 may be formed on a fixed frame 102 to sense a rotational speed of the rotary portion 200. The second sensor 150 may be a light emitter of an infrared sensor. The second sensor 150 may be located on an outer portion of the fixed frame 102 and be directed in a direction facing the rotary portion 200.

As shown in FIG. 8, the second sensor 150 may be formed on the fixed driving circuit 120 instead of on the fixed frame 102. In this case, for example, an infrared ray may be emitted via a hole 105 defined in the fixed frame 102.

A first sensor 250 may be formed on a rotating frame 201. The first sensor 250 may be a light receiver of the infrared sensor. The first sensor 250 may be located at an outer portion of the rotating frame 201 and directed in a direction facing the fixed portion 100.

As shown in FIG. 8, the first sensor 250 may be formed on a rotating driving circuit 210 rather than on the rotating frame 201. In this case, for example, the infrared ray may be received via a hole 205 defined in the rotating body frame 201.

Hereinafter, a connected portion of the rotary portion 200 and the fixed portion 100 will be disassembled and described in detail.

Figure 9:
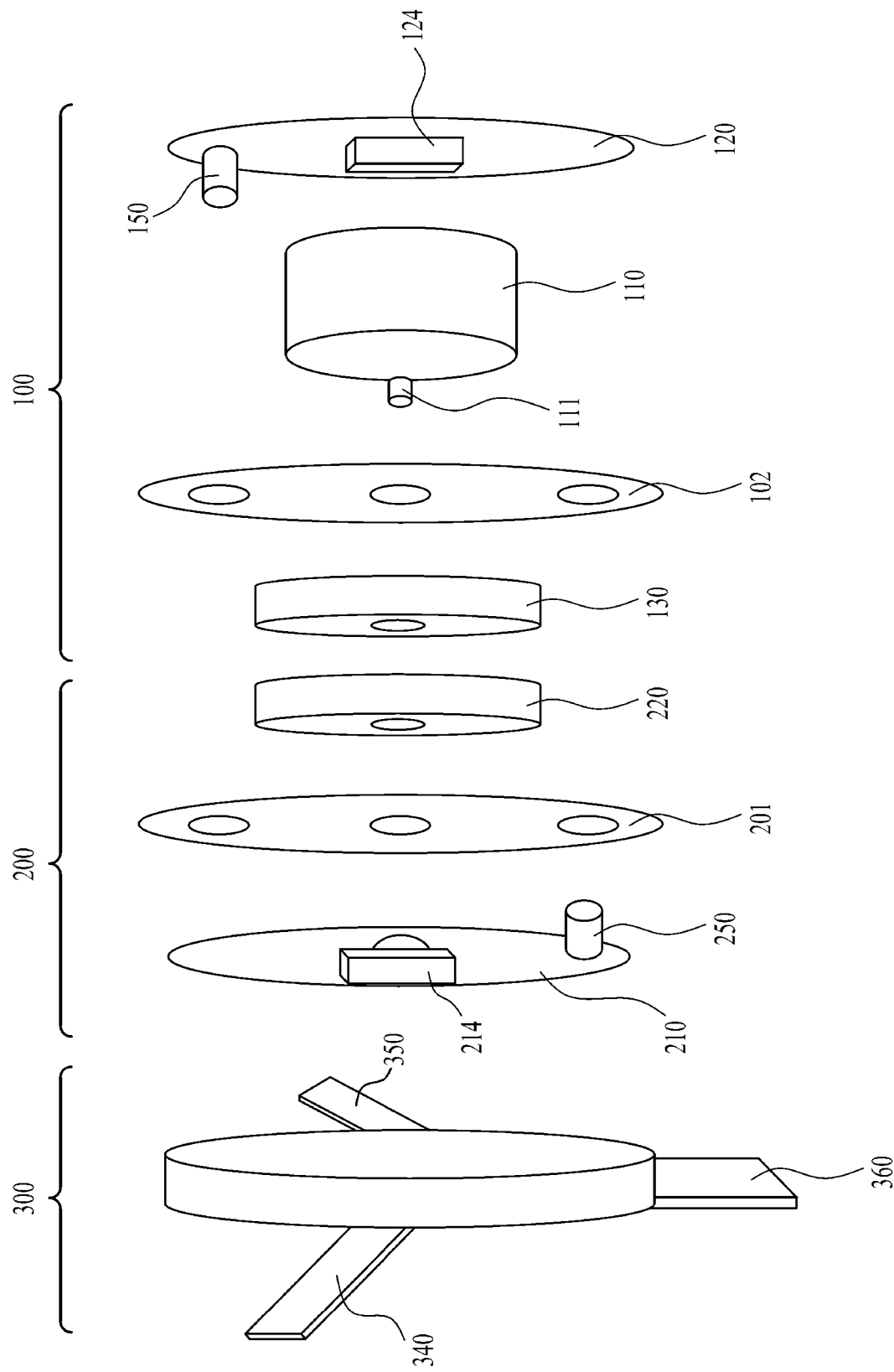
FIG. 9 is an exploded schematic view of a connection portion of a rotary portion and a fixed portion in a rotatable display device.

FIG. 9 is an exploded schematic view of a connection portion of a rotary portion and a fixed portion in a rotatable display device. Although a fan type rotatable display device is shown in FIG. 9, contents below may be applied to the cylinder type rotatable display device.

The display device may include the fixed portion 100, the rotary portion 200 connected to the fixed portion 100, and the light source module 300 connected to the rotary portion 100.

The fixed portion 100 may include the fixed frame 102 constituting a main body, the motor 110 disposed on the fixed frame 102 to rotatably drive the rotary portion 200, the second sensor 150 that senses a speed and a phase of the rotary portion 200, and a motor controller 124 that controls at least one of a rotational speed and a phase of the motor 110 using second sensed values obtained via the second sensor 150.

The fixed frame 102 may have a structure corresponding to the frame structure shown in FIGS. 1 and 2 and may constitute the main body of the fixed portion 100. Specifically, the frame structure may include the lower frame for supporting the fixed portion 100 at the bottom, the upper frame that protects the fixed portion 100 at the top, and the connecting frame for connecting the lower and upper frames to each other. The fixed frame 102 may have a structure corresponding to the upper frame of the frame structure.

The motor 110 may be electrically connected to the fixed driving circuit 120 located on the lower frame 101 of the frame structure, and may be disposed inside the fixed frame structure, that is, on the fixed driving circuit 120. Specifically, a central axis of the motor 110 located in the fixed portion 100 and a central axis of rotation of the rotary portion 200 may be positioned on the same axis.

Even when the motor 110 does not have a built-in encoder, the motor may be applied because the speed of the rotary portion 200 can be sensed by the first and second sensors 150 and 250 to be described later. In this case, a cost of the motor 110 may be reduced. However, when the encoder is built-in, because the motor may dual-sense the speed and the phase of the rotary portion 200 together with the first and second sensors 150 and 250, more precise sensing is possible.

The second sensor 150 may be formed on the fixed frame 102 and sense the rotational speed of the rotary portion 200. The second sensor 150 may be the light emitter of the infrared sensor. The second sensor 150 may be located at the outer portion of the fixed frame 102 and directed in the direction facing the rotary portion 200.

The motor controller 124 may be located on the fixed driving circuit 120 and control the fixed driving circuit 120, the motor 110, and the second sensor 150.

Specifically, the motor controller 124 may control at least one of the rotational speed and the phase of the motor 110 using rotational speed and phase information (hereinafter, referred to as the second sensed values) of the rotary portion sensed by the second sensor 150.

The rotary portion 200 may include the rotating frame 201 connected to the fixed portion 100 and rotating, the first sensor 250 that senses the rotational speed and the phase of the rotary portion 200, and the image output controller 214 for controlling image output of the light source module 300 using first sensed values obtained via the first sensor 250.

In this regard, the rotating frame 201 may have a structure corresponding to the frame structure shown in FIGS. 1 and 2, and may constitute a main body of the rotary portion 200. Specifically, the frame structure may include the lower frame for supporting the rotary portion 200 at the bottom, the upper frame that protects the rotary portion 200 at the top and is connected to the light source module 300, and the connecting frame for connecting the lower and upper frames to each other. The rotating frame 102 may have a structure corresponding to the lower frame of the frame structure.

The motor 110 may include the driving shaft 111 of the motor that is directed in a direction toward the rotary portion 200 and rotates. The driving shaft 111 may be located at a center of the motor 110. The driving shaft 111 may pass through the fixed frame 102 of the fixed portion 100 and be coupled to the first side of the rotary portion 200. In this regard, the first side of the rotary portion 220 may be the rotating frame 201 positioned at a lower side of the rotary portion 200. Hereinafter, the case in which the first side of the rotary portion 200 coupled to the motor 110 is the lower frame 201 will be described as an example. However, the present disclosure is not limited thereto.

The first sensor 250 may be formed on the rotating frame 201. The first sensor 250 may be the light receiver of the infrared sensor. The first sensor 250 may be located at the outer portion of the rotating frame 201 and may be directed in the direction facing the fixed portion 100.

The image output controller 214 may be fixed by the rotating frame 201 and be positioned within the rotary portion 200 to drive the light-emitting diodes positioned on the one or more panels disposed in the light source module 300.

Specifically, the image output controller 214 may transmit an image signal to the light-emitting diodes. That is, the image output controller 214 may be electrically connected to the light-emitting diodes and output the image signal to the light-emitting diodes.

The transmission coil 130 and the receiving coil 220 may be disposed between the fixed frame 102 and the rotating frame 201.

The light source module 300 may be connected to the rotary portion 200 and may include one or more panels 340, 350, and 360.

The light source module 300 may be composed of a single or a plurality of panels 340, 350, and 360. In the display device, the single or plurality of panels 340, 350, and 360 may rotate 360 degrees to form a continuous surface with the afterimages. In this regard, the one or more panels 340, 350, and 360 may be in the fan type forming a radial shape with the rotary portion 200 as a center or may be in the cylindrical type positioned vertically along a circumference of the rotary portion 200.

The one or more panels 340, 350, and 360 may include a light-emitting diode. There may be a plurality of light-emitting diodes, any type of light-emitting diode may be applied, and preferably, red (R), green (G), and blue (B) light-emitting diodes may be used.

In the one or more panels 340, 350, and 360, portions not equipped with the light-emitting diodes may have a black color to increase a contrast ratio.

In the rotatable display device in FIG. 9, even when the motor controller 124 inputs a constant speed value to the motor 110, the motor 110 may not rotate constantly at the input speed. That is, the speed input to the motor 110 and the speed at which the motor 110 actually rotates may be different from each other, and the speed at which the motor 110 actually rotates may not be constant. Hereinafter, a change in the rotational speed of the motor 110 over time will be described in detail.

Figure 10:
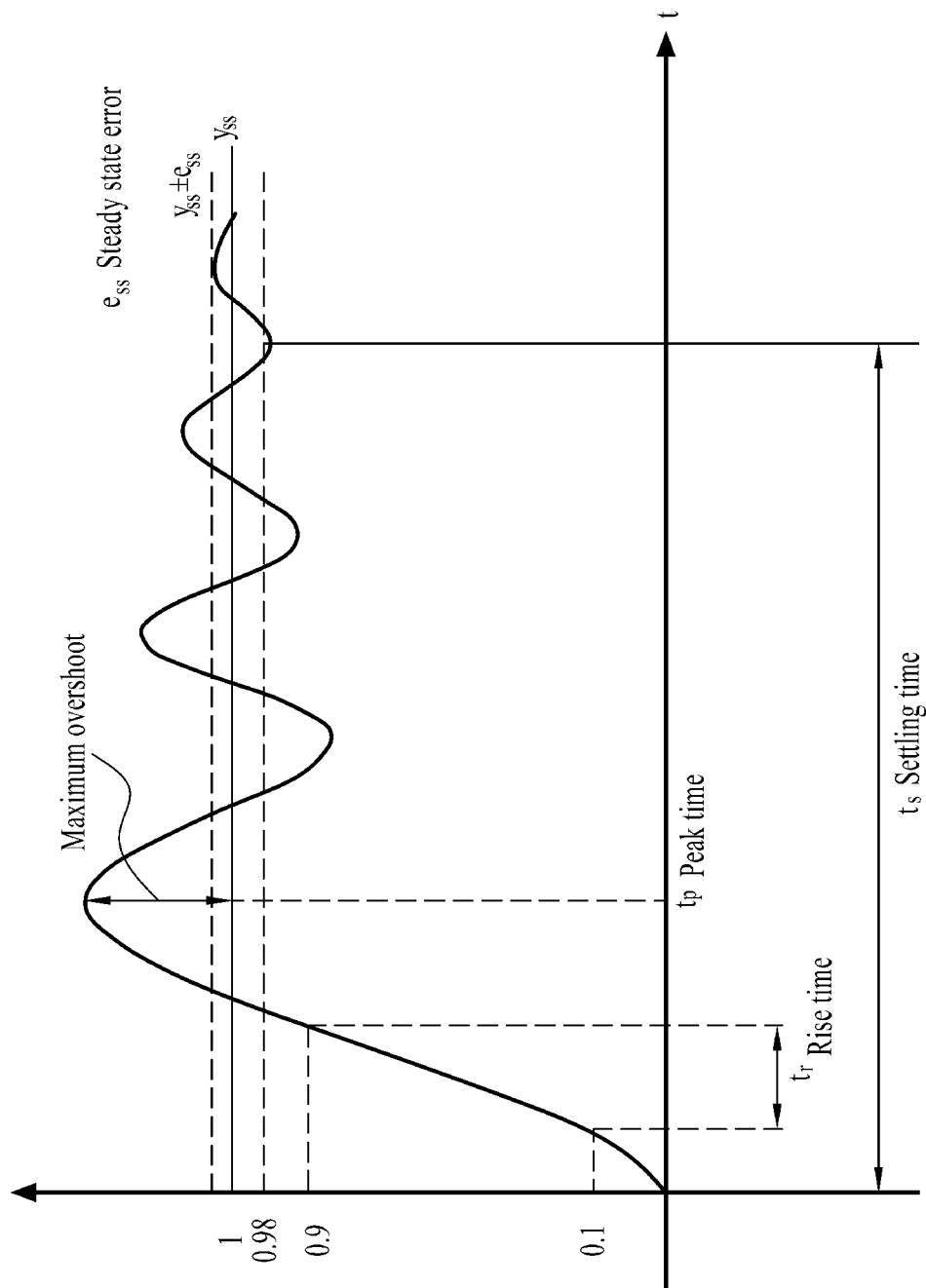
FIG. 10 is a graph showing a process in which a speed of a motor reaches a steady state in a rotatable display device.

FIG. 10 is a graph showing a process in which a speed of a motor reaches a steady state in a rotatable display device. Here, the steady state may mean a state in which the motor is driven within an error range of 0.02% between the motor input value and the measured value.

Referring to FIG. 10, a settling time (ts) means a time taken for the speed of the motor to reach the steady state when the motor is rotated. A rise time (tr) means a time taken for the rotational speed of the motor to reach a certain value, that is, 90% of the speed input value. Overshoot means a case in which the rotational speed of the motor is higher than the speed input value. A steady state error (ess) means an error after the speed of the motor reaches the steady state.

As shown in FIG. 10, when the motor controller inputs the speed input value to the motor, the motor may reach the steady state through the rise time. In this regard, even when the motor reaches the steady state, the motor may rotate with the steady state error without rotating with a constant speed of the speed input value. That is, the speed of the motor may be different from the speed input value.

The rotatable display device must constantly maintain an output position of the image. However, because the physical position of the light source module changes with time, it is necessary to synchronize a rotation period of the motor with an output period of the image.

However, because the speed of the motor is not constant, it is difficult to synchronize the rotation period of the motor with the output period of the image.

Further, in the rotatable display device, in order to keep a starting point of the image constant, it is necessary to equally set positional standards for the rotating body and the fixed body in the rotatable display device.

To solve such problem, the rotatable display device had a separate sensor capable of sensing the rotational speed of the rotary portion. Specifically, in an existing rotatable display device, an IR sensor light emitter was disposed in the fixed portion and an IR sensor light receiver was disposed in the rotary portion to measure the speed and phase values of the rotary portion.

There was a problem in that, because the sensed value can only be obtained from the controller located in the fixed portion, the controller located within the rotary portion cannot obtain the speed and phase values of the rotary portion.

In order to keep the starting point of the image constant, light output from the light receiver of the rotary portion had a certain delay time. In this case, because the motor is driven without feedback on a current rotational speed, the rotational speed was able to be varied because of a temperature change, a change in operating characteristics of the motor, or the like. In addition, as the rotational speed varies, the synchronization between the rotation period of the motor and the output period of the image becomes unstable, so that there was a problem that a phase difference varies based on the output delay time of the light receiver of the rotary portion and the starting point of the image also changes.

In the present disclosure, a technology capable of performing constant speed control of the motor disposed in the rotatable display device and performing precise position control of the image is presented.

Figure 11:
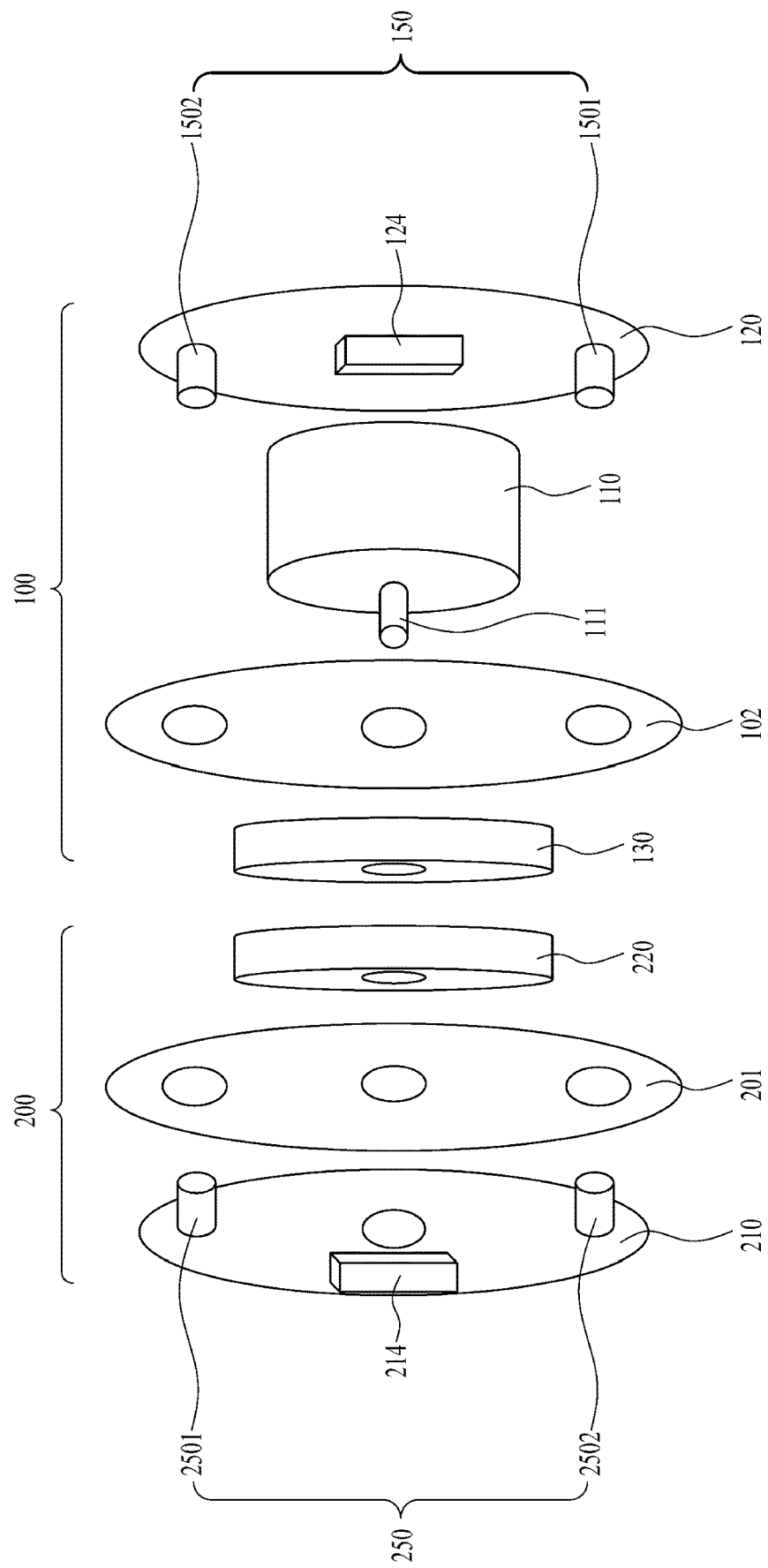
FIG. 11 is an exploded schematic view of a connection portion of a rotary portion and a fixed portion in a rotatable display device according to one embodiment.

FIG. 11 is an exploded schematic view of a connection portion of a rotary portion and a fixed portion in a rotatable display device according to one embodiment.

The display device may include the fixed portion 100, the rotary portion 200 connected to and disposed on the fixed portion 100, and the light source module 300 connected to and disposed on the rotary portion 100. For a description of the same component, see FIG. 9.

The fixed portion 100 may be supported by the fixed frame 102, and the rotary portion 200 may be supported by the rotating frame 201. Each of the fixed frame 102 and the rotating frame 201 may have at least one hole defined along a circumferential direction. In addition, in order to support the driving shaft 111 of the motor, a hole may be defined at a central axis of each of the fixed frame 102 and the rotating frame 201.

The fixed portion 100 may include the second sensor 150 and the rotary portion 200 may include the first sensor 250.

The second sensor 150 may be formed on the fixed frame 102 and may sense the rotational speed of the rotary portion 200. However, as shown in FIG. 11, the second sensor 150 may be disposed on the fixed driving circuit 120 instead of on the fixed frame 102. In this case, the second sensor 150 disposed on the fixed driving circuit 120 may obtain the sensed value via the hole defined in the fixed frame 102.

There may be a plurality of second sensors 150. As there are the plurality of sensors, a resolution capable of sensing the rotational speed of the rotary portion may be increased. In this regard, the second sensor 150 may be any one that can sense at least one of the phase and the speed of the rotary portion 200.

The first sensor 250 may be formed on the rotating frame 201. However, as shown in FIG. 11, the first sensor 250 may be disposed on the rotating driving circuit 210 instead of on the rotating frame 201. In this case, the first sensor 250 disposed on the rotating driving circuit 210 may obtain the sensed value via the hole defined in the rotating frame 201.

There may be a plurality of first sensors 250. As there are the plurality of sensors, the resolution capable of sensing the rotational speed of the rotary portion may be increased. In this regard, the first sensor 250 may be any one that can sense at least one of the phase and the speed of the rotary portion 200.

A light emitter 1501 may be disposed on the fixed frame 102. The light emitter 1501 may emit the infrared ray. In order to receive light emitted from the light emitter 1501 disposed on the fixed frame 102, a first light receiver 2501 may be disposed on the rotating frame 201.

The light emitter 2501 may be disposed on the rotating frame 201. The light emitter 2501 may emit the infrared ray. A second light receiver 1502 may be disposed on the fixed frame 102 to receive the light emitted from the light emitter 2501 disposed on the rotating frame 2501.

Specifically, the measured speed and phase values of the rotary portion 200 may be obtained based on amounts of the infrared rays received by the light receiver 2502 and the first light receiver 1502 that are irradiated from the light emitter 1501 and the first light emitter 2501 and reflected on an object.

The motor controller 124 may control the speed of the motor 110 by comparing the speed and phase values measured as such with the input speed of the motor 110 and then outputting a corrected speed of the motor 110.

When there are the plurality of sensors, the motor controller 124 may output and control the speed of the motor 110 corrected based on the output of the infrared sensor light receiver 2502 located in the rotary portion 200. Specifically, when the speeds or the phases of the rotary portion 200 obtained from the plurality of sensors are different from each other, the motor controller 124 may put more weight on a value measured by the infrared sensor light receiver 2502 located in the rotary portion 200 to output the speed corrected value of the motor 110.

When there are the plurality of sensors, the plurality of sensors may be positioned along circumferences of the fixed frame 102 and the rotating frame 201. When each of the light emitters 1501 and 2501 and each of the light receivers 1502 and 2502 are disposed on each of the fixed frame 102 and the rotating frame 201, each of the light emitters 1501 and 2501 and the light receivers 1502 and 2502 may be positioned such that a phase difference is 180 degrees.

Figure 12:
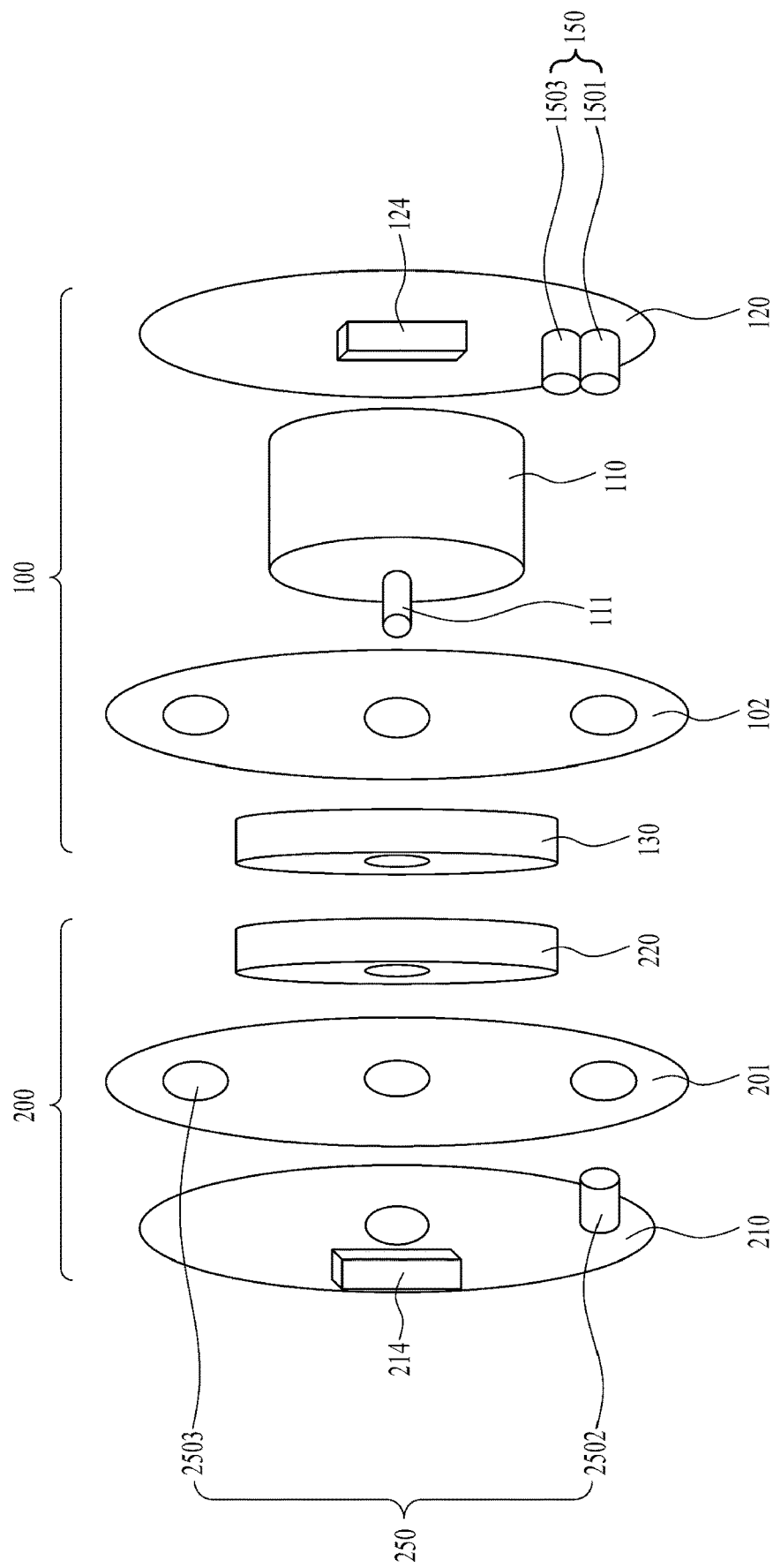
FIG. 12 shows another embodiment of a second sensor.

FIG. 12 shows another embodiment of a second sensor.

The display device may include the fixed portion 100, the rotary portion 200 connected to the fixed portion 100, and the light source module 300 connected to the rotary portion 100. For a description of a duplicated component, refer to the contents described above.

The fixed portion 100 may include the second sensor 150, and the rotary portion 200 may include the first sensor 250.

The second sensor 150 may include the light emitter 1501 and a third light receiver 1503. The third light receiver 1503 may be disposed on the fixed frame 102, and preferably may be formed at the outer portion of the fixed frame 102 along the circumference of the fixed frame 102. However, as shown in FIG. 12, the third light receiver 1503 may be disposed on the fixed driving circuit 120 instead of on the fixed frame 102. In this case, the third light receiver 1503 may sense light reflected from a reflector disposed in the rotary portion 200 to be described later via the hole defined in the fixed frame 102.

The first sensor 250 may include the first light receiver 2502 and a reflector 2503. The reflector 2503 may be disposed on the rotating frame 201, and may be preferably formed at the outer portion of the rotating frame 201 along the circumference of the rotating frame 201. Specifically, the reflector 2503 may be defined in the hole defined in the rotating frame 201. However, the present disclosure may not be limited thereto, and the reflector 2503 may be disposed on the rotating driving circuit 210. In this case, the reflector 2503 may reflect the light irradiated from the light emitter 1501 disposed in the fixed portion 100 via the hole defined in the rotating frame 201. When the reflector 2503 is applied to the first sensor 250, a component cost may be further reduced.

The infrared ray emitted from the light emitter 1501 is received by the first light receiver 2502, so that the measured speed and phase values of the rotary portion 200 may be obtained. In addition, the infrared ray emitted from the light emitter 1501 may be reflected by the reflector 2503 and received by the third light receiver 1503, so that the measured speed and phase values of the rotary portion 200 may be obtained.

The light emitter 1501 and the third light receiver 1503 may be located on the fixed frame 102 at a position where the phase difference is 0 degrees instead of 180 degrees along the circumference. Specifically, the light emitter 1501 and the third light receiver 1503 may be disposed side by side so as to be directed in the same direction instead of facing each other. Accordingly, the third light receiver 1503 does not receive the infrared ray directly emitted from the light emitter 1501, but may receive the light reflected by the approaching reflector 2503. However, the present disclosure is not limited to such structure.

In this regard, there may be a plurality of reflectors 2503 along a rotational circumferential direction of the rotating frame 201. Therefore, a sensing ability for the rotary portion 200 may be improved.

Figure 13:
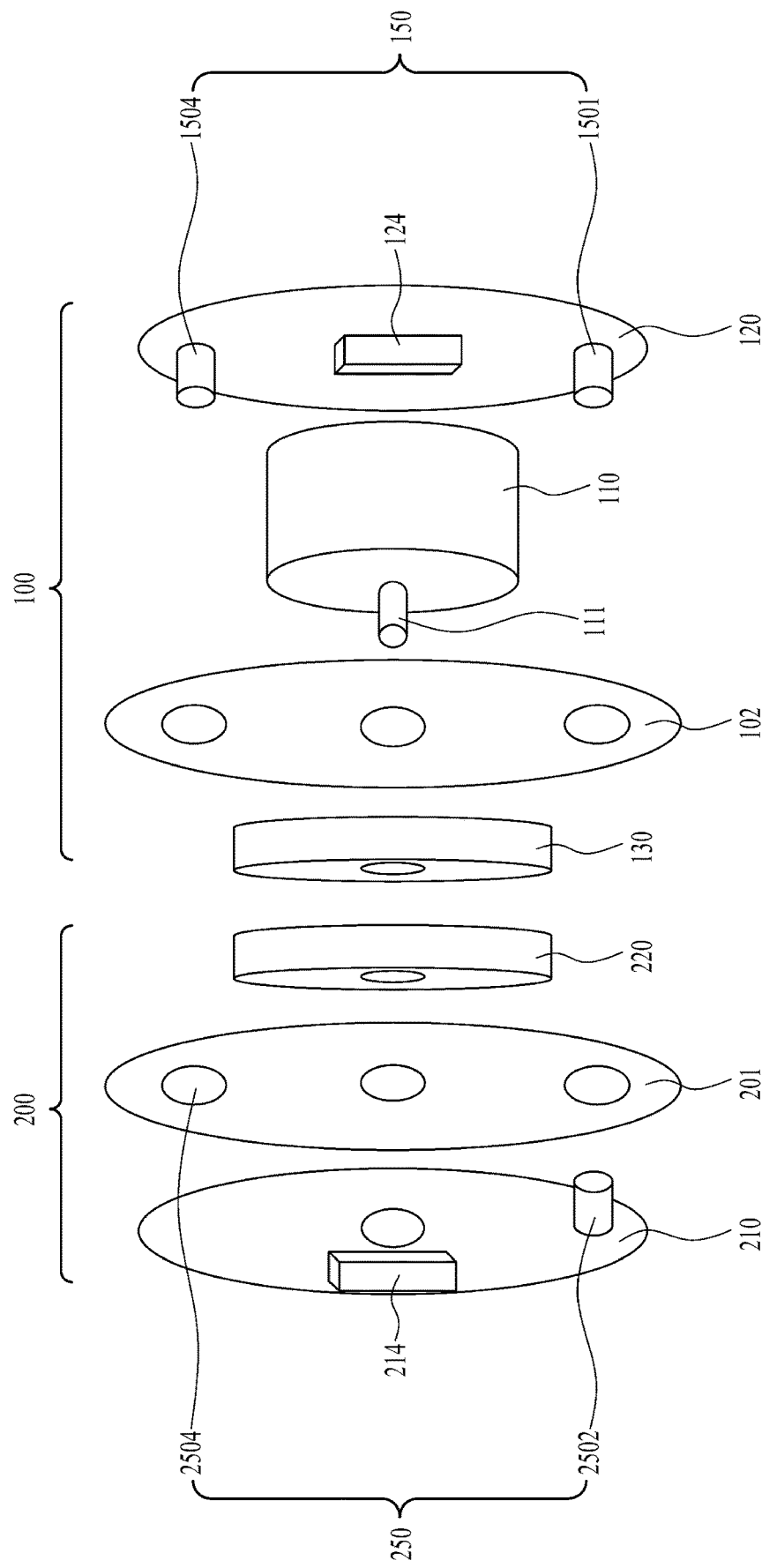
FIG. 13 shows another embodiment of a second sensor.

FIG. 13 shows another embodiment of the second sensor.

The display device may include the fixed portion 100, the rotary portion 200 connected to the fixed portion 100, and the light source module 300 connected to the rotary portion 100. For a description of a duplicated component, refer to the contents described above.

The fixed portion 100 may include the first sensor 250, and the rotary portion 200 may include the second sensor 150.

The second sensor 150 may include a light emitter 1501 and a hall sensor 1504. The hall sensor 1504 may be disposed on the fixed frame 102, and may be preferably formed at the outer portion of the fixed frame 102 along the circumference of the fixed frame 102. However, the hall sensor 1504 may be disposed on the fixed driving circuit 120 instead of on the fixed frame 102 as shown in FIG. 13. In this case, the hall sensor 1504 may sense a magnetic field generated from a magnetic body 2504 disposed in the rotary portion 200 to be described later via the hole defined in the fixed frame 102.

The first sensor 250 may include the first light receiver 2502 and the magnetic body 2504. The magnetic body 2504 may be disposed on the rotating frame 201, and preferably, may be formed at the outer portion of the rotating frame 201 along the circumference of the rotating frame 201. Specifically, the magnetic body 2504 may be defined in the hole defined in the rotating frame 201. However, the present disclosure may not be limited thereto, and the magnetic body 2504 may be disposed on the rotating driving circuit 210. In this case, the magnetic material 2504 may emit a magnetic field generated via the hole defined in the rotating frame 201.

The hall sensor 1504 may sense a change in voltage based on an intensity of the magnetic field. That is, the measured speed and phase of the rotary portion 200 may be obtained by the hall sensor 1504 sensing the magnetic field generated by the magnetic body 2504 of the rotary portion 100.

Hereinabove, the configuration of the display device according to one embodiment of the present disclosure has been described in detail. Hereinafter, the process of controlling the speed of the motor 110 based on the measured speed and phase obtained by the motor controller 124 of the display device will be described in detail.

Figure 14:
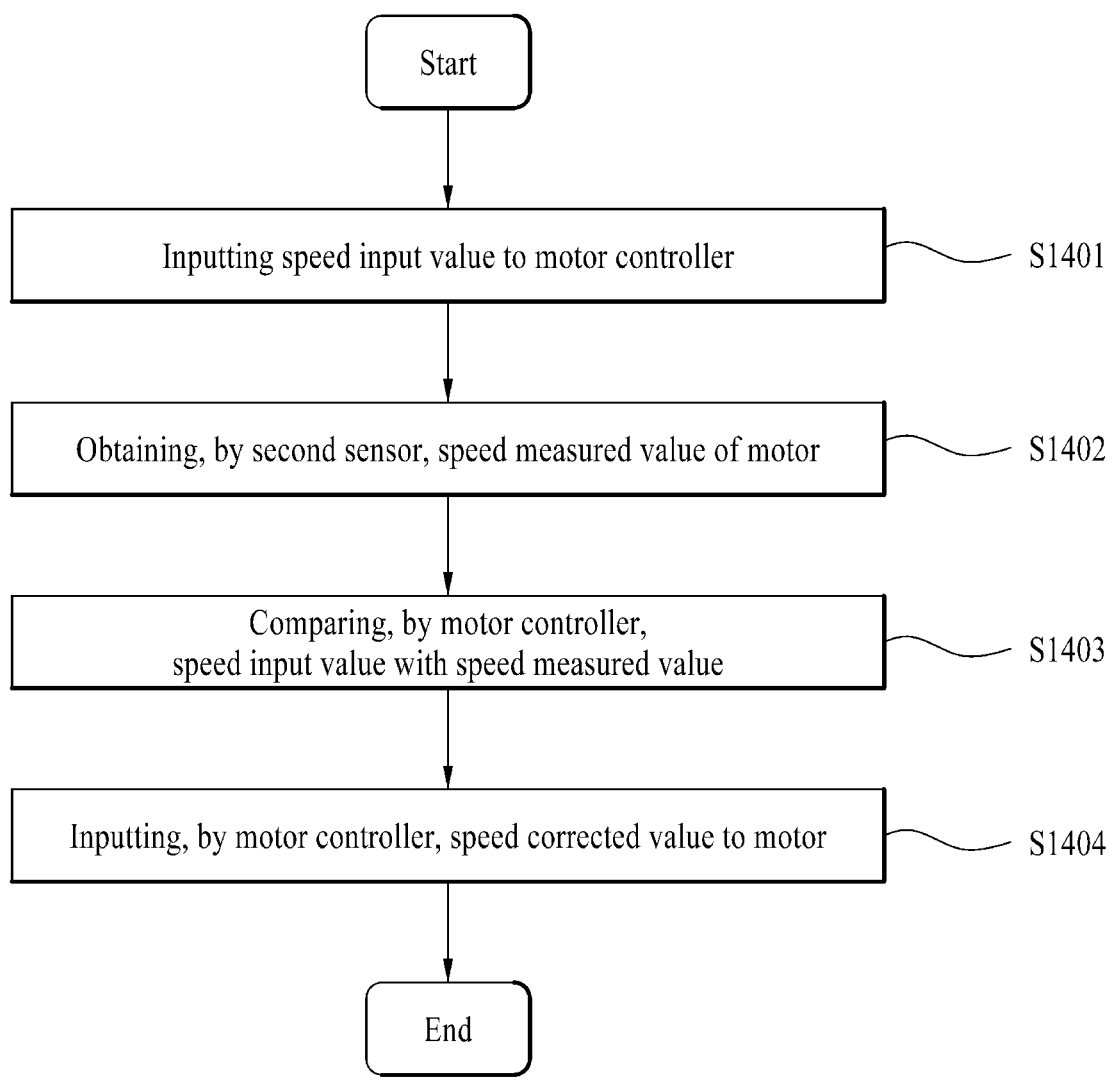
FIG. 14 is a flowchart illustrating a control method for controlling a speed in a display device according to an embodiment of the present disclosure.

FIG. 14 is a flowchart illustrating a control method for controlling a speed in a display device according to an embodiment of the present disclosure.

The display device may include the fixed portion including the fixed driving connected to the rotary portion and emitting the light.

The control method may include inputting the speed input value to the motor controller (s1401). In this regard, the motor controller may drive the motor such that the motor is driven based on the speed input value.

However, the speed at which the motor actually rotates may differ from the speed input value of the motor depending on a performance of the motor and an environment such as an ambient temperature. In order to minimize the difference between the speed at which the motor actually rotates and the speed input value of the motor, the display device may include the sensors on the rotary portion and the fixed portion. In this regard, there may be the plurality of sensors to improve the resolution at which the speed and the phase of the rotary portion are sensed. Any sensor may be used as long as it can measure the speed and the phase. For example, the sensor may be an infrared sensor, a laser sensor, a magnetic sensor, a proximity sensor, or the like.

In this regard, the second sensor may be disposed on the fixed driving circuit, and the first sensor may be disposed on the rotating driving circuit.

The control method may include obtaining, by a second sensor, the speed measured value of the motor (s1402).

In addition, the control method may include comparing, by the motor controller, the speed input value with the speed measured value (s1403). Specifically, when the speed measured value is smaller than the speed input value, the speed of the motor may be controlled by making a new speed input value (hereinafter, referred to as a speed corrected value) of the motor greater. On the other hand, when the speed measured value is greater than the speed input value, the speed of the motor may be controlled by making the motor speed corrected value smaller.

Via such comparison operation, the control method may include inputting, by the motor controller, the speed corrected value to the motor (s1404). That is, the motor controller may perform the constant speed control of the motor using the speed measured value of the motor.

Figure 15:
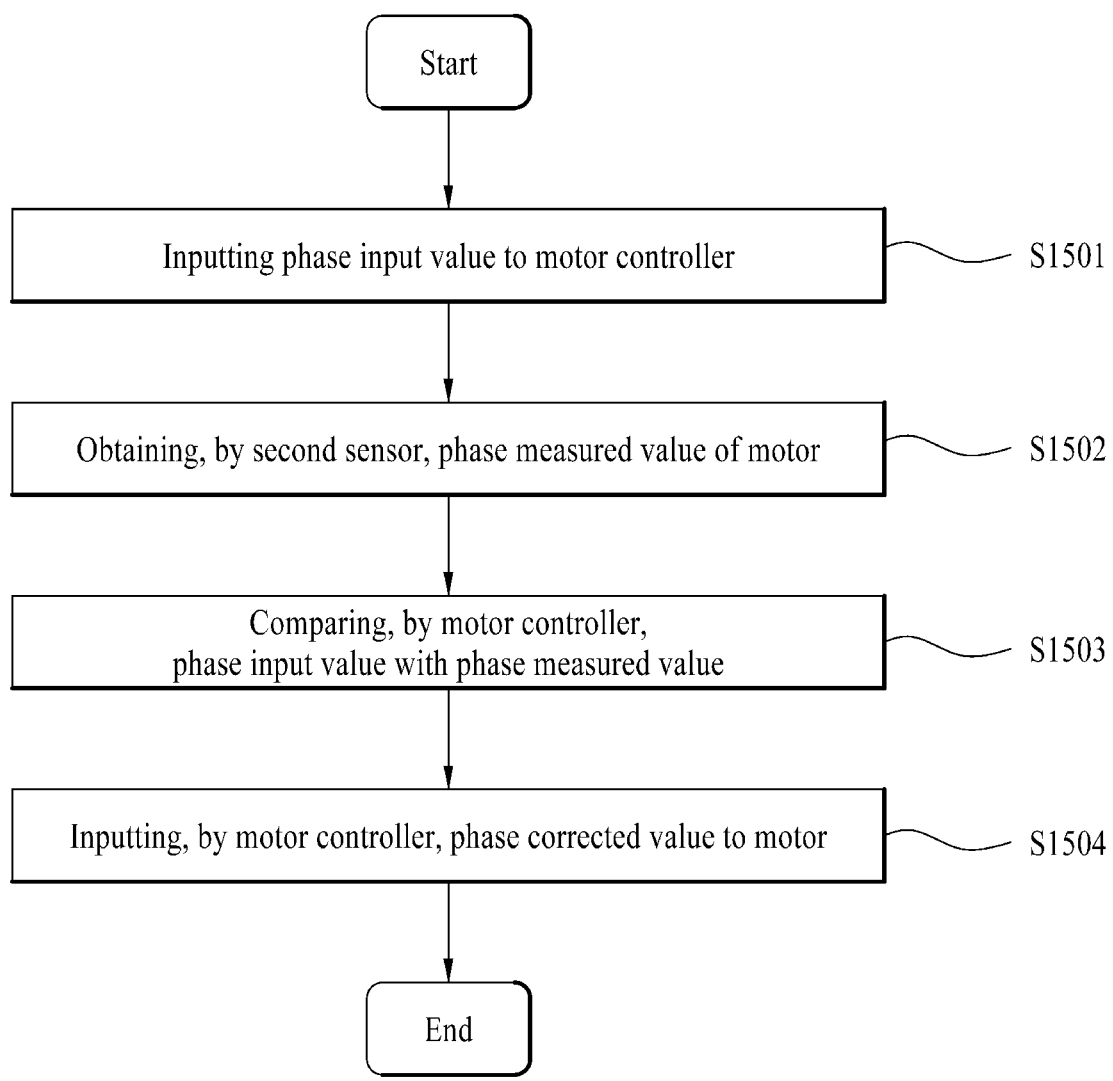
FIG. 15 is a flowchart illustrating a control method for controlling a speed in a display device according to one embodiment of the present disclosure.

FIG. 15 is a flowchart illustrating a control method for controlling a speed in a display device according to one embodiment of the present disclosure.

The display device may include the fixed portion including the fixed driving connected to the rotary portion and emitting the light. For a description of a duplicated component, refer to the contents described above.

The control method may include inputting a phase input value to the motor controller (s1501). In this regard, the motor controller may drive the motor such that the rotary portion is driven based on the phase input value.

The control method may include obtaining, by the second sensor, a phase measured value of the motor (s1502).

In addition, the control method may include comparing, by the motor controller, the phase input value with the phase measured value (s1503). Specifically, when the phase measured value is smaller than the phase input value, the speed of the motor may be controlled by making a new phase input value (hereinafter, referred to as a phase corrected value) of the motor greater. On the other hand, when the measured phase value is greater than the phase input value, the speed of the motor may be controlled by making the phase corrected value of the motor smaller.

Via such comparison operation, the control method may include inputting, by the motor controller, the phase corrected value to the motor (s1504). That is, the motor controller may perform constant phase control of the motor using the phase input value of the motor.

In this regard, a manipulation amount of the motor may vary depending on a motor type, such as a linear voltage, pulse width modulation (PMW), and pulse frequency modulation (PFM).

Figure 16:
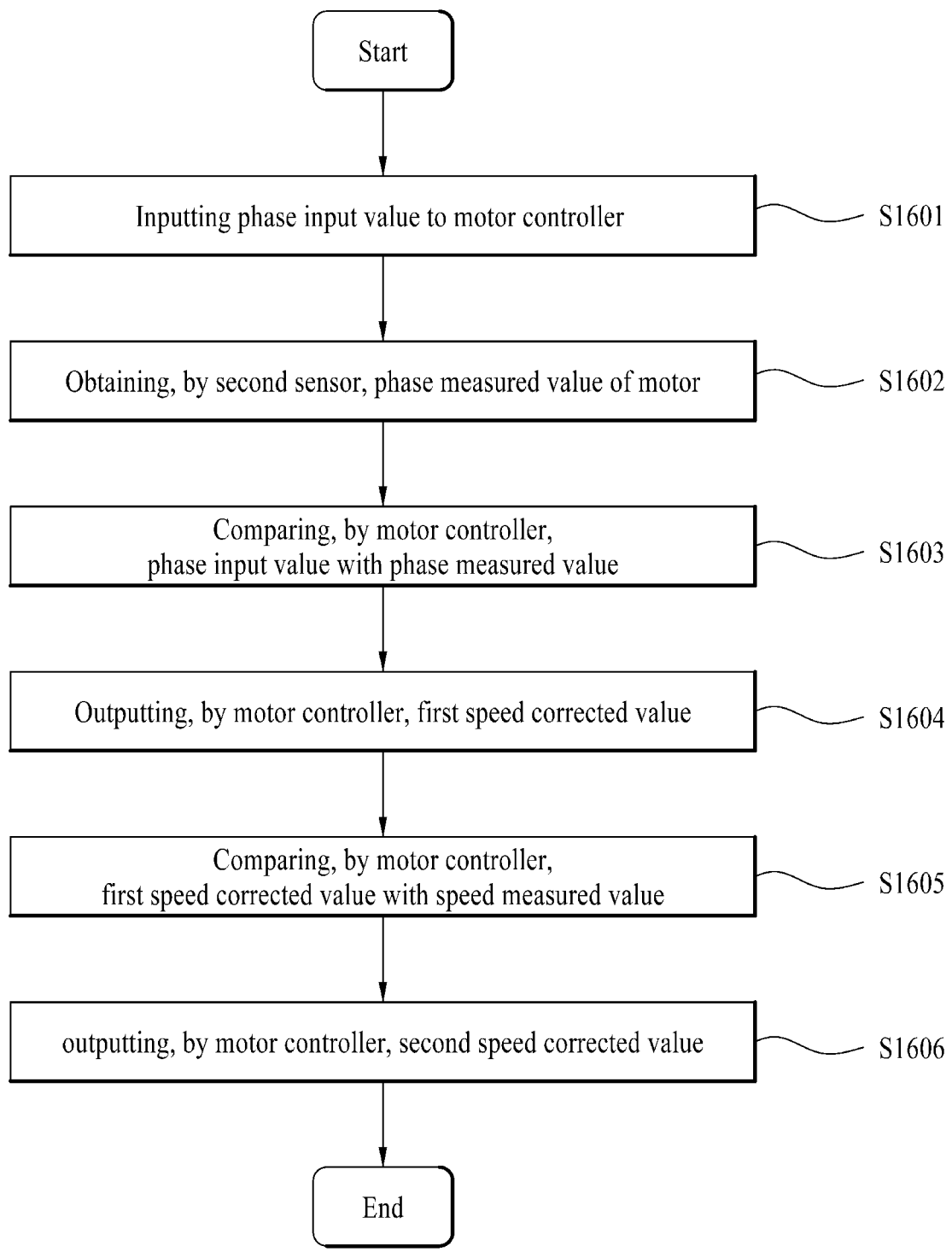
FIG. 16 is a flowchart illustrating a control method for controlling a speed in a display device according to one embodiment of the present disclosure.

FIG. 16 is a flowchart illustrating a control method for controlling a speed in a display device according to one embodiment of the present disclosure.

The display device may include the fixed portion including the fixed driving circuit, the rotary portion disposed on the fixed portion and including the rotating driving circuit, and the light source module connected to the rotary portion and emitting the light. For a redundant description, refer to the contents described above.

The control method may include inputting the phase input value to the motor controller (s1601) and obtaining, by the second sensor, the phase measured value of the motor (s1602).

In addition, the control method may include comparing, by the motor controller, the phase input value with the phase measured value (s1603). Specifically, when the phase measured value is smaller than the phase input value, the speed of the motor may be controlled by making the new phase input value (hereinafter, referred to as the phase corrected value) of the motor greater. On the other hand, when the phase measured value is greater than the phase input value, the speed of the motor may be controlled by making the phase corrected value of the motor smaller.

Via such comparison operation, the control method may include outputting, by the motor controller, a first speed corrected value (s1604). That is, the motor controller may operate the motor such that the motor is driven with the output first speed corrected value.

The control method may include comparing, by the motor controller, the first speed corrected value with the speed measured value (s1605). Specifically, when the speed measured value is smaller than the first speed corrected value, the speed of the motor may be controlled by making a new speed input value (hereinafter, referred to as a second speed corrected value) of the motor greater. On the other hand, when the speed measured value is greater than the first speed corrected value, the speed of the motor may be controlled by making the second speed corrected value of the motor smaller.

Via such comparison step, the control method may include inputting, by the motor controller, the second speed corrected value to the motor (s1606). That is, the motor controller may perform the constant phase control of the motor and sequentially perform the constant speed control of the motor.

In this regard, the motor controller may obtain a reference speed, which is a speed of the motor for performing the constant phase control of the motor, and compare the reference speed with the speed measured value of the motor to perform the constant speed control of the motor with the reference speed value.

Figure 17:
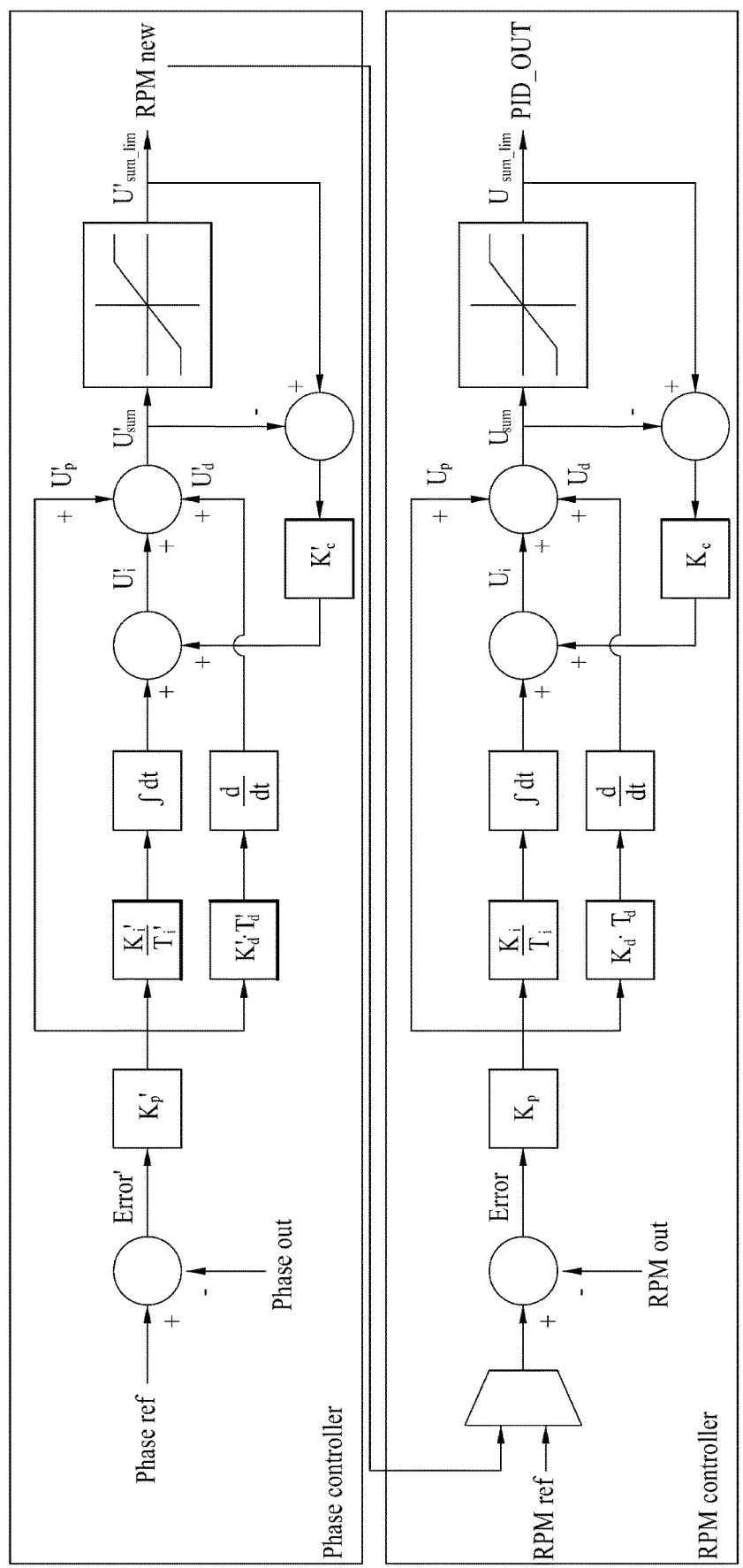
FIG. 17 illustrates a case in which a display device according to one embodiment of the present disclosure includes a PID controller.

FIG. 17 illustrates a case in which a display device according to one embodiment of the present disclosure includes a PID controller.

In order to perform the constant speed control and the constant phase control of the motor, the motor controller may further include a PID controller. In this regard, an appropriate motor controller such as an MCU, an AP, and a SOC may be used depending on a system support situation.

As the PID controller is included, a duration of a transient state may be reduced and a stable rotational speed may be maintained at the steady state.

In FIG. 17, Phase_ref means the phase input value, and Phase_out means the phase measured value measured by the second sensor.

When phase control precedes, RPM_new calculated based on the phase control may be input as the speed input value. PID_out, a motor control value, may be calculated by comparing RPM_new with RPM_out, the speed measured value measured by the second sensor.

When the phase control does not precede, the RPM_new value set as the speed input value may be input to the motor controller. PID_out, the motor control value, may be calculated by comparing RPM_new with RPM_out, the speed measured value measured by the second sensor.

Specifically, by calculating an error (Error') of Phase_ref and Phase_out, a sum (U'sum) of a proportional controller value (Up'), an integral controller value (Ui'), and a derivative controller value (Ud') may be calculated via the error (Error'). RPM_new may be calculated by comparing U'sum with a limit value (U'sum_lim).

Specifically, by calculating an error (Error) of RPM_new and RPM_out, a sum (Usum) of a proportional controller value (Up), an integral controller value (Ui), and a derivative controller value (Ud) may be calculated via the error (Error). PID_out may be calculated by comparing Usum with a limit value (Usum_lim).

Figure 18:
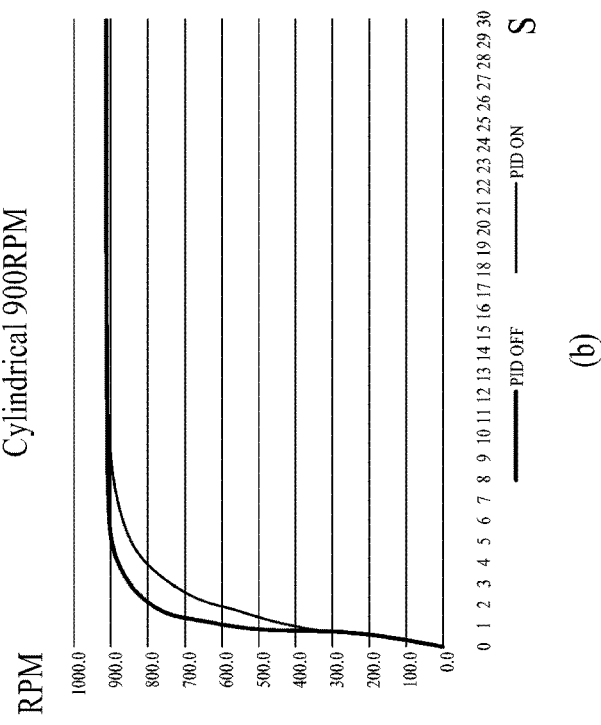
FIG. 18 shows result values according to the embodiment of applying the PID controller shown in FIG. 17.

FIG. 18 shows result values according to the embodiment of applying the PID controller shown in FIG. 17.

In FIG. 18, a cylinder type rotatable display device having a speed input value of the motor of 900 rpm has been described, but the speed input value may be changed or the display device may be of the fan type.

A table in FIG. 18 shows the result values measured for 100 seconds at 15 minute intervals by driving the display device for 30 minutes when the PID controller is applied. In this regard, in a case of PID gain setting, an experiment was conducted by setting 900 rpm as an optimal control standard.

As shown in FIG. 18, it may be seen that, the steady state error (ess) is smaller and the settling time (ts) is also smaller in the case in which the PID controller is applied than a case in which the PID controller is not applied. Furthermore, it may be seen that, when the PID controller is applied, a degree of variation of an average value (yss) for each section is small. That is, it may be seen that, when the PID controller is applied, because the steady state is quickly reached, the settling time is short and stability after reaching the steady state is greater.

Figure 19:
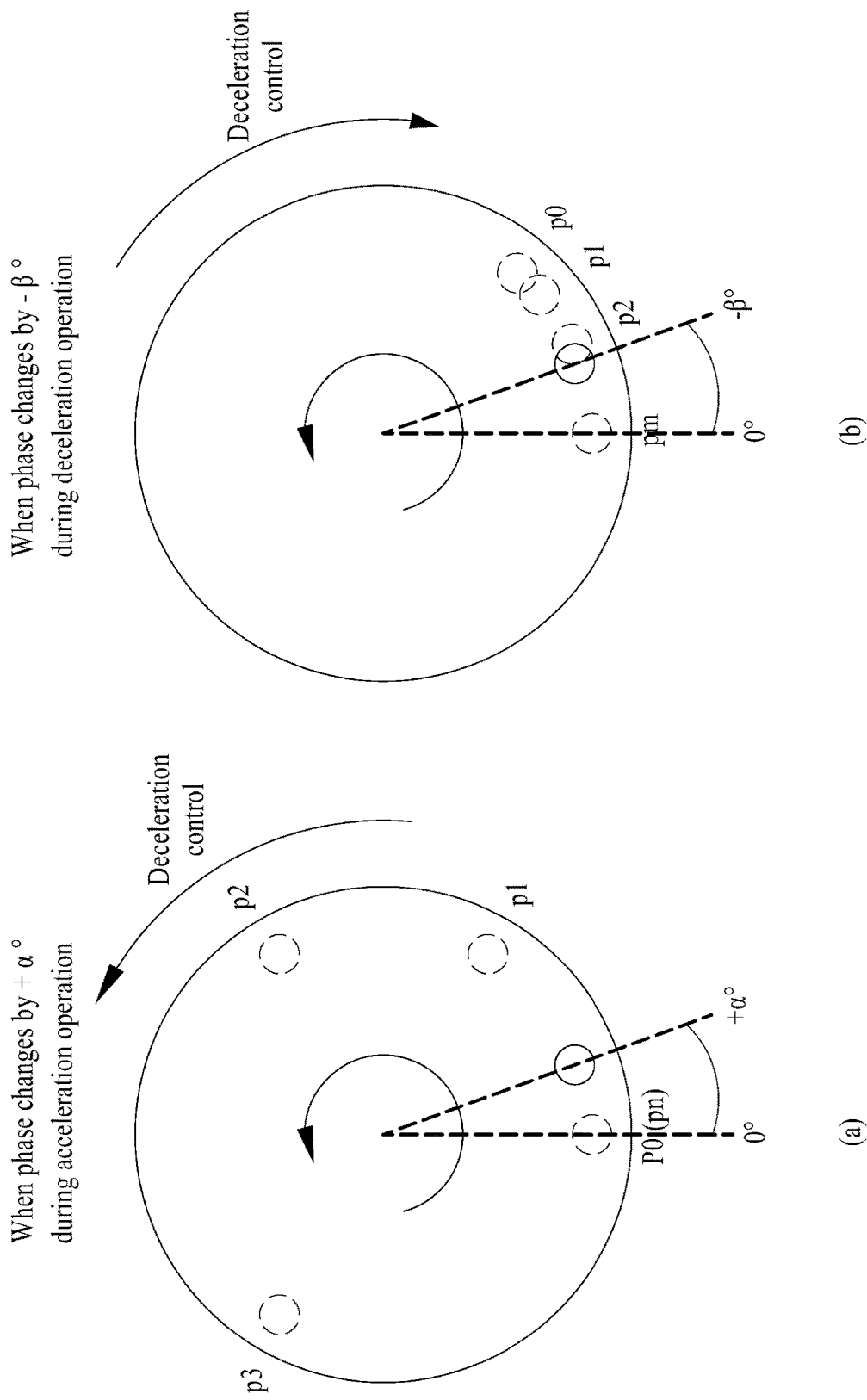
FIG. 19 is a diagram for illustrating a processor for controlling a phase of a motor in a deceleration or acceleration operation according to one embodiment of the present disclosure.

FIG. 19 is a diagram for illustrating a processor for controlling a phase of a motor in a deceleration or acceleration operation according to one embodiment of the present disclosure.

(a) in FIG. 19 is a diagram illustrating an operation in which the motor controller accelerates the motor. For example, (a) in FIG. 19 illustrates a state in which the motor rotates during the rise time before reaching 900 rpm when the speed input value is 900 rpm.

p1 to pn show phases of the rotary portion when the fixed portion performs constant phase control of the rotary portion. For example, because the motor is accelerating, when a phase at an initial starting point is p0, a phase after rotating for one period may be located at p1 during the constant phase control. When rotating for one period again at p1, the phase may be located at p2 during the constant phase control. When rotating for n periods at p2, the phase may be located at pn during the constant phase control.

However, an actual phase of the rotary portion may be positioned by moving by a instead of positioned at p1 to pn because of external or other factors. In this case, because a phase recognized by the fixed portion and a phase recognized by the rotary portion are misaligned, the synchronization of the output image may not be performed well.

Therefore, in the operation in which the motor controller accelerates the motor, the reference speed may be set as an acceleration reference speed in order to perform the constant phase control of the motor in a rotational direction. That is, by setting the acceleration reference speed greater than the reference speed as the reference speed, a time for the speed of the motor to reach the steady state may be shortened.

(b) in FIG. 19 is a diagram illustrating an operation in which the motor controller decelerates the motor. For example, (b) in FIG. 19 illustrates a state in which the motor rotates during the deceleration control to reach 900 rpm from a speed equal to or higher than 900 rpm when the speed input value is 900 rpm.

p1 to pm show phases of the rotary portion when the fixed portion performs the constant phase control of the rotary portion. For example, because the motor is decelerating, when the phase at the initial starting point is p0, the phase after rotating for one period may be located at p1 during the constant phase control. When rotating for one period again at p1, the phase may be located at p2 during the constant phase control. When rotating for m periods at p2, the phase may be located at pm during the constant phase control.

However, the actual phase of the rotary portion may be positioned by moving by β instead of positioned at p1 to pm. In this case, because the phase recognized by the fixed portion and the phase recognized by the rotary portion are misaligned, the synchronization of the output image may not be performed well.

Therefore, in the operation in which the motor controller decelerates the motor, the reference speed may be set as a deceleration reference speed in order to perform the constant phase control of the motor in an opposite direction of the rotational direction. That is, by setting the deceleration reference speed smaller than the reference speed as the reference speed, the time for the speed of the motor to reach the steady state may be shortened.

As described above, the motor controller may obtain the phase of the rotary portion to perform the acceleration control or the deceleration control of the motor, so that a position where a frame is output from the light source module may be adjusted and the image output controller may output the image based on the adjusted position of the frame.

Figure 20:
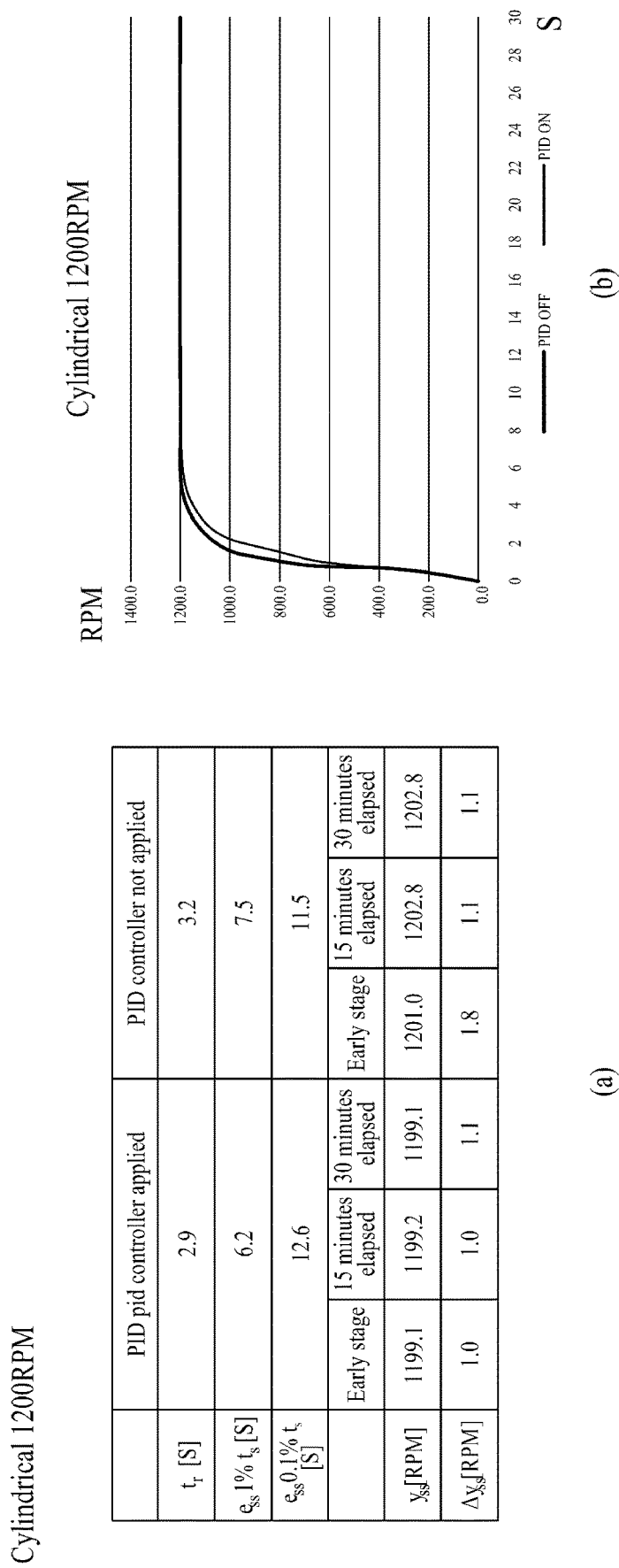
FIG. 20 is for controlling a speed according to one embodiment, and is a diagram illustrating a case in which an input speed is equal to or higher than a reference speed.

FIG. 20 is for controlling a speed according to one embodiment, and is a diagram illustrating a case in which an input speed is equal to or higher than a preset speed.

FIG. 20 shows result values based on whether the PID controller is applied when the speed input value of the motor is 1200 rpm in the cylinder type rotatable display device. It may be seen that the rise time (tr) is 0.3 seconds longer in the case in which the PID controller is not applied than in the case in which the PID controller is applied, but, after reaching the steady state, the average value (yss) for each section is stable regardless of whether the PID controller is applied and is less affected by disturbance.

That is, it may be seen that, when the motor has the speed input value higher than an arbitrary speed, the result value does not change depending on whether the PID controller is applied. Such arbitrary speed is referred to as a preset speed.

Hereinafter, a method for controlling the speed of the motor by comparing the input speed of the motor with the preset speed will be described in detail.

Figure 21:
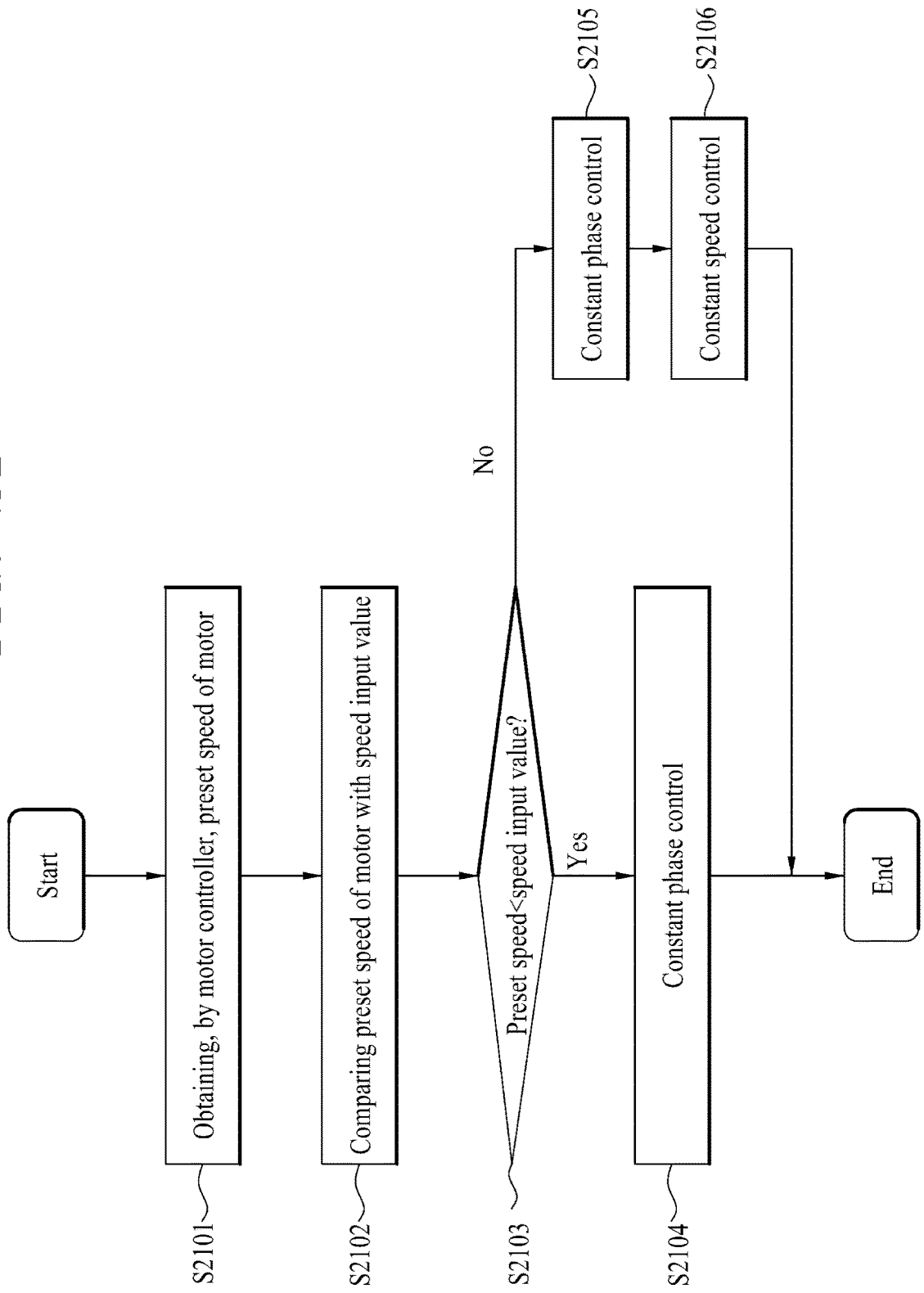
FIG. 21 is a flowchart illustrating a control method for controlling a speed of a motor based on a reference speed in a display device according to an embodiment of the present disclosure.

FIG. 21 is a flowchart illustrating a control method for controlling a speed of a motor based on a preset speed in a display device according to an embodiment of the present disclosure.

The display device may include the fixed portion including the fixed driving circuit, the rotary portion disposed on the fixed portion, and the light source module connected to the rotary portion and emitting the light. For a redundant description, refer to the contents described above.

The control method may include obtaining, by the motor controller, the preset speed of the motor (s2101). The preset speed may mean the arbitrary value at which the times to reach the settling time in the case in which the PID controller is applied and in the case in which the PID controller is not applied are the same as each other or similar to each other. In this regard, the preset speed may mean an arbitrary value at which the settling time may be reached even when only one of the constant speed control and the constant phase control is applied.

The control method may include comparing, by the motor controller, the preset speed of the motor with the speed input value (s2102 and s2103).

In this regard, when the speed input value is equal to or greater than the preset speed, the constant phase control of the motor may be performed and the constant speed control may be omitted (s2104). Because an error between the speed input value and the speed measured value may be minimized without performing the constant speed control, power consumption may be effectively prevented by omitting the constant speed control.

In this regard, when the speed input value is smaller than the preset speed, the constant phase control of the motor may be performed (s2105), and then the constant speed control may be sequentially performed (s2106). By performing both of the constant phase control and the constant speed control, the error between the speed input value and the speed measured value may be minimized.

In this regard, the motor may include a geared encoder motor including the second sensor and a reducer. In this case, dual sensing is possible, so that the speed and the phase of the rotary portion may be measured more precisely.

As such, according to the embodiment of the present disclosure, the constant speed control and the precise position control of the rotatable display device are possible without using an expensive motor.

The above description is merely illustrative of the technical spirit of the present disclosure. It will be apparent to those skilled in the art that various modifications and variations can be made in the present disclosure without departing from the spirit and scope of the disclosure.

Therefore, the embodiments disclosed in the present disclosure are merely illustrative of the technical spirit of the present disclosure. The scope of the technical spirit of the present disclosure is not limited by these embodiments. The scope of the present disclosure should be construed by the appended claims, and all technical ideas within the scope equivalent thereto should be construed as falling within the scope of the present disclosure.

What is claimed is:

1. A rotatable display device comprising a fixed portion and a rotary portion rotating relative to the fixed portion,
   wherein the rotary portion includes:
   a rotating frame connected to the fixed portion and rotating;
   a light source module disposed on the rotating frame and including at least one panel;
   a first sensor for sensing a rotational speed and a phase of the rotary portion; and
   an image output controller configured to control output of an image using the light source module using first sensed values obtained via the first sensor,
   wherein the fixed portion includes:
   a fixed frame constituting a main body thereof;
   a motor disposed on the fixed frame and rotationally driving the rotating frame;
   a second sensor for sensing the rotational speed and the phase of the rotary portion; and
   a motor controller configured to control at least one of a rotational speed and a phase of the motor using second sensed values obtained via the second sensor, and
   wherein the motor controller is configured to compare a speed input value of the motor with a speed measured value of the motor obtained via the second sensor to perform constant speed control of the motor with a speed corrected value of the motor.

2. The rotatable display device of claim 1, wherein the first sensor includes a first light receiver for receiving light irradiated from a light emitter disposed on the fixed frame.

3. The rotatable display device of claim 2, wherein the second sensor includes a second light receiver for receiving light irradiated from a light emitter disposed on the rotating frame.

4. The rotatable display device of claim 2, wherein the rotating frame includes a reflector for reflecting light emitted from the light emitter,
   wherein the second sensor includes a third light receiver for receiving light reflected by the reflector.

5. The rotatable display device of claim 4, wherein the rotating frame includes a plurality of reflectors along a rotational circumferential direction.

6. The rotatable display device of claim 1, wherein the second sensor is a hall sensor for sensing a magnetic field of a magnetic body disposed in the rotating frame.

7. The rotatable display device of claim 1, wherein the motor controller is configured to compare a phase input value of the motor with a phase measured value of the motor obtained via the second sensor to perform constant phase control the motor with a phase corrected value of the motor.

8. The rotatable display device of claim 1, wherein the motor controller includes a PID controller for performing constant speed control and precise position control of the motor.

9. The rotatable display device of claim 1, wherein the motor controller is configured to perform constant phase control of the motor and sequentially perform constant speed control of the motor.

10. The rotatable display device of claim 9, wherein the motor controller is configured to obtain a reference speed that is a speed of the motor for performing the constant phase control of the motor, and compare the reference speed with the speed measured value of the motor to perform the constant speed control of the motor with the reference speed value.

11. The rotatable display device of claim 10, wherein the motor controller is configured to set the reference speed as an acceleration reference speed to perform the constant phase control of the motor in a rotational direction in an operation of accelerating the motor.

12. The rotatable display device of claim 10, wherein the motor controller is configured to set the reference speed as a deceleration reference speed to perform the constant phase control of the motor in an opposite direction of a rotational direction in an operation of decelerating the motor.

13. The rotatable display device of claim 1, wherein the motor controller is configured to perform constant phase control and sequentially perform constant speed control of the motor based on the speed input value of the motor being smaller than a preset speed.

14. The rotatable display device of claim 1, wherein the motor controller is configured to perform constant phase control of the motor and omit constant speed control based on the speed input value of the motor being equal to or greater than a preset speed.

15. A method for controlling a rotatable display device comprising a fixed portion and a rotary portion rotating relative to the fixed portion, wherein the rotary portion includes a first sensor for sensing a rotational speed and a phase of the rotary portion, and the fixed portion includes a motor for driving the rotary portion, a second sensor for sensing the rotational speed and the phase of the rotary portion and a motor controller configured to control at least one of the rotational speed and a phase of the motor using second sensed values obtained via the second sensor, the method comprising:
  comparing a speed input value of the motor with a speed measured value of the motor obtained via the second sensor to perform constant speed control of the motor with a speed corrected value of the motor; and
  comparing a phase input value of the motor with a phase measured value of the motor obtained via the second sensor to perform constant phase control of the motor with a phase corrected value of the motor,
  wherein the motor controller includes a PID controller for performing the constant speed control and precise position control of the motor.

16. The method of claim 15, wherein, after performing the constant phase control of the motor, the constant speed control of the motor is sequentially performed.

17. The method of claim 16, further comprising obtaining a reference speed that is a speed of the motor for performing the constant phase control of the motor, and comparing the reference speed with the speed measured value of the motor to perform the constant speed control of the motor with the reference speed value.

18. The method of claim 15, wherein, based on the speed input value of the motor being smaller than a preset speed, the constant phase control is performed and the constant speed control of the motor is sequentially performed.

19. The method of claim 15, wherein, based on the speed input value of the motor being equal to or greater than a preset speed, the constant phase control of the motor is performed and the constant speed control is omitted.

* * * * *